United States Patent
Béalle et al.

(10) Patent No.: US 10,892,414 B2
(45) Date of Patent: Jan. 12, 2021

(54) PROCESS FOR MAKING ELECTRONIC DEVICE

(71) Applicant: Merck Patent GmbH, Darmstadt (DE)

(72) Inventors: Gaelle Béalle, Heidelberg (DE); Christoph Leonhard, Otzberg (DE); Hsin-Rong Tseng, Frankfurt am Main (DE); Manuel Hamburger, Mannheim (DE); Beate Burkhart, Darmstadt (DE); Katja Maria Scheible, Darmstadt (DE); Anja Jatsch, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 16/466,487

(22) PCT Filed: Dec. 4, 2017

(86) PCT No.: PCT/EP2017/081305
§ 371 (c)(1),
(2) Date: Jun. 4, 2019

(87) PCT Pub. No.: WO2018/104202
PCT Pub. Date: Jun. 14, 2018

(65) Prior Publication Data
US 2020/0066990 A1     Feb. 27, 2020

(30) Foreign Application Priority Data
Dec. 6, 2016   (EP) ..................................... 16202544

(51) Int. Cl.
*H01L 51/00* (2006.01)
*H01L 51/50* (2006.01)

(52) U.S. Cl.
CPC ...... *H01L 51/0007* (2013.01); *H01L 51/5012* (2013.01); *H01L 51/5056* (2013.01)

(58) Field of Classification Search
CPC ............. H01L 51/0007; H01L 51/5056; H01L 51/5012
(Continued)

(56) References Cited

U.S. PATENT DOCUMENTS 9,099,655 B2    8/2015  Pan et al.
10,236,445 B2   3/2019  Riegel et al.
(Continued)

FOREIGN PATENT DOCUMENTS

DE   102015103742 A1   9/2016
WO   WO-2010136111 A1  12/2010

OTHER PUBLICATIONS

Chiba, T., et al., "Solution-Processed White Phosphorescent Tandem Organic Light-Emitting Devices", Advanced Materials, vol. 27, No. 32, (2015), pp. 4681-4687.
(Continued)

*Primary Examiner* — Mohammad M Hoque
(74) *Attorney, Agent, or Firm* — Faegre Drinker Biddle & Reath LLP

(57) ABSTRACT

Described herein is a process for the preparation of an electronic device such as an organic electroluminescent device (OLED), wherein two adjacent functional layers having an interface are formed from solution in a kinetically controlled manner. The process is particularly suitable for fast and efficient production of electronic devices by printing or coating processes. The description further relates to an electronic device which is obtainable by said process.

19 Claims, 7 Drawing Sheets

| 100 nm | Al Cathode |
|---|---|
| 40 nm | ETL |
| 10 nm | HBL |
| 60 nm | G-EML |
| 20 nm | HTL |
| 30 nm | HIL |
| 50 nm | ITO Anode |
|  | Substrate |

(58) Field of Classification Search
USPC .......................................................... 438/99
See application file for complete search history.

(56) References Cited

U.S. PATENT DOCUMENTS

| | | |
|---|---|---|
| 2005/0191927 A1 | 9/2005 | Gambogi et al. |
| 2008/0113101 A1* | 5/2008 | Inoue ..................... C09B 1/00 |
| | | 427/384 |
| 2012/0056170 A1* | 3/2012 | Pan ..................... H01L 51/004 |
| | | 257/40 |
| 2012/0205637 A1 | 8/2012 | Cheon et al. |
| 2013/0256636 A1* | 10/2013 | Watanabe ........... H01L 51/0037 |
| | | 257/40 |

OTHER PUBLICATIONS

Gaikwad, A., et al., "Identifying orthogonal solvents for solution processed organic transistors", Organic Electronics, vol. 30, (2016), pp. 18-29 with Supporting Information, pp. 1-12.
Ho, S., et al., "Review of recent progress in multilayer solution-processed organic light-emitting diodes", Journal of Photonics for Energy, vol. 5, (2015), pp. 057611-1-057611-17.
International Search Report for PCT/EP2017/081305 dated Feb. 28, 2018.
Liaptsis, G., et al., "Solution Processed Organic Double Light-Emitting Layer Diode Based on Cross-Linkable Small Molecular Systems", Angewandte Chemie International Edition in English, vol. 52, (2013), pp. 9563-9567.
Written Opinion of the International Searching Authority for PCT/EP2017/081305 dated Feb. 28, 2018.

* cited by examiner

| Soaking time [sec] | 0 | 60 | 120 | 180 | 300 | dry |
|---|---|---|---|---|---|---|
| Solvent damaging layer |  |  |  |  |  |  |
| Solvent NOT damaging layer |  |  |  |  |  |  |
| Diameter measured |  | | | | | |

| KPI | Description | DI | Image |
|---|---|---|---|
| 0 – 2 | Very Stable | ++ |  |
| 3 – 5 | Stable | + |  |
| 6 – 20 | Usable | o |  |
| > 20 | Dissolution | – |  |

| First Functional Layer Material | Second Solvent (CAS number) | KPI | DI | Image |
|---|---|---|---|---|
| HTM-2 | 3586-14-9 | 22 | - |  |
| HTM-2 | 16409-46-4 | 2 | ++ |  |
| HTM-2 | 6243-10-3 | 123 | - |  |
| HTM-2 | 770-35-4 | 2 | ++ |  |
| HTM-2 | 103-93-5 | 3 | + |  |
| HTM-1 | 3586-14-9 | 11 | 0 |  |
| HTM-1 | 16409-46-4 | 0 | ++ |  |
| HTM-1 | 6243-10-3 | 1 | ++ |  |
| HTM-1 | 770-35-4 | 1 | ++ |  |
| HTM-1 | 103-93-5 | 2 | ++ |  |

Figure 8:

| | | | | |
|---|---|---|---|---|
| HTM-3 | 3586-14-9 | 115 | - | |
| HTM-3 | 16409-46-4 | 5 | + | |
| HTM-3 | 6243-10-3 | 160 | - | |
| HTM-3 | 103-93-5 | 170 | - | |
| HTM-5 | 3586-14-9 | 300 | - | |
| HTM-5 | 16409-46-4 | 200 | - | |
| HTM-5 | 6243-10-3 | 88 | - | |
| HTM-5 | 770-35-4 | 5 | + | |
| HTM-4 | 3586-14-9 | 330 | - | |
| HTM-4 | 16409-46-4 | 110 | - | |

Figure 8:

| | | | | |
|---|---|---|---|---|
| HTM-4 | 6243-10-3 | 84 | - | |
| HTM-4 | 770-35-4 | 2 | ++ | |
| HTM-6 | 3586-14-9 | 44 | - | |
| HTM-6 | 16409-46-4 | 75 | - | |
| HTM-6 | 6243-10-3 | 68 | - | |
| HTM-6 | 770-35-4 | 4 | + | |
| HTM-7 | 3586-14-9 | 61 | - | |
| HTM-7 | 16409-46-4 | 1 | ++ | |
| HTM-7 | 6243-10-3 | 19 | 0 | |

Figure 9:

| | |
|---|---|
| 100 nm | Al Cathode |
| 40 nm | ETL |
| 10 nm | HBL |
| 60 nm | G-EML |
| 20 nm | HTL |
| 30 nm | HIL |
| 50 nm | ITO Anode |
| | Substrate |

PROCESS FOR MAKING ELECTRONIC DEVICE

CROSS-REFERENCE TO RELATED APPLICATIONS

This application is a national stage application (under 35 U.S.C. § 371) of PCT/EP2017/081305, filed Dec. 4, 2017, which claims benefit of European Application No. 16202544.9, filed Dec. 6, 2016, both of which are incorporated herein by reference in their entirety.

TECHNICAL FIELD

The present invention relates to a process for the preparation of an electronic device such as an organic electroluminescent device (OLED), wherein two adjacent functional layers having an interface are formed from solution in a kinetically controlled manner. The process is particularly suitable for a fast and efficient production of electronic devices by printing or coating processes. The present invention furthermore relates to an electronic device which is obtainable by said process.

BACKGROUND ART

Traditionally, OLEDs have been fabricated by vacuum deposition for small molecule materials, and by spin-coating or dip coating for polymeric materials. More recently, other techniques such as inkjet printing have been used to directly deposit organic thin film layers in the fabrication of OLEDs. Such techniques were found to be cost efficient and suitable for scale-up. One of the main challenges in multi-layer printing is to identify and adjust the respective printing parameters in order to obtain a homogeneous deposition of inks on the substrate thereby creating well-defined and uniform functional layers which give good device performance. In multi-layer printing processes, there is always the risk of a detachment, partial dissolution, redissolution or other impairment of the existing functional layers on the substrate on which a new functional layer is printed. This results in defects in the functional layers' interface which leads to a lower device performance. Therefore, methods were developed in the prior art, in which a second functional layer is printed on a first functional layer which has been previously cross-linked. For this purpose, cross-linkable functional materials are needed. The cross-linking of the first organic functional material prevents a detachment, partial dissolution, redissolution or other impairment of the first functional layer when the second functional layer is printed on top. Thereby, interfaces with no defects may be produced between two functional layers.

G. Liaptsis et al. describe solution processed organic double light-emitting layer diodes which are based on cross-linkable small molecular systems (Angew. Chem. Int. Ed. 2013, 52, 9563-9567). The synthesis and characterization of new-crosslinkable green-emitting $Ir^{III}$ complexes and spirobifluorene as host materials are described herein.

Furthermore, in US 2012/0205637 A1 an OLED is formed from small molecule organic semiconductor materials which are deposited from liquid compositions (inkjet fluids) by inkjet printing to from functional layers which may be cross-linked. N-methylpyrrolidone (NMP), ethyl benzoate, benzyl acetate and 1-tetralone are used as solvents in the inkjet fluids. The OLED manufacturing process in US 2012/0205637 A1 is as follows: an hole injection layer (HIL) is made by inkjet printing an HIL inkjet fluid onto a substrate, followed by vacuum drying for 10 min at room temperature. The resulting organic layer is then subjected to hot plate baking at 250° C. for 30 min to remove more solvent and to cross-link the HIL material. A hole transport layer (HTL) is made by inkjet printing an HTL inkjet fluid onto the cross-linked HIL, followed by vacuum drying for 10 min at room temperature. The resulting organic layer is then subjected to hot plate baking at 200° C. for 30 min to remove more solvent and to cross-link the HTL material. An emissive layer (EML) is made by inkjet printing of an EML inkjet fluid onto the cross-linked HTL, followed by vacuum drying for 10 min at room temperature and then followed by baking at 100° C. for 60 min. A hole blocking layer (HBL), electron transport layer (ETL), electron injection layer containing LiF and an aluminum electrode (cathode) were sequentially vacuum deposited in a conventional fashion.

The OLED manufacturing process described in US 2012/0205637 A1 requires a large number of different process steps, such as inkjet printing, drying, cross-linking and vacuum deposition steps. The process is thus characterized by a high complexity and requires complex equipment for production. It is therefore of interest to find new ways to produce OLEDs by simplified procedures in a cost efficient way.

As an alternative, multi-layer printing techniques were developed which rely on the so-called orthogonal solvent concept. Here, a first organic compound is deposited from solution containing a first solvent. After drying the first organic compound layer, a second organic compound is deposited from solution containing a second solvent on the first organic compound layer and the dried. The first organic compound is soluble in the first solvent and the second organic compound is soluble in the second solvent. However, the second solvent is selected such that the first organic compound is not soluble therein. Thus, the orthogonal solvent concept enables the deposition of several layers of organic compounds by solution processes without damaging the underlaid layer.

US 2005/0191927 A1 relates to a process for forming an organic electronic device comprising at least two organic layers, wherein said process comprises (a) applying a first organic layer comprising a first organic material by a method selected from vapor deposition and liquid deposition from a first organic liquid medium; and (b) applying a second organic layer comprising a photoactive compound directly over at least a portion of the first organic layer by liquid deposition from a second organic liquid medium, wherein the first organic material is sparingly soluble in the second organic liquid medium.

T. Chiba et al. describe solution-processed white phosphorescent tandem OLEDs (Adv. Mater. 2015, 27, 4681-4687). It was found that orthogonal solubility of materials used in adjacent layers and their thermal stabilities are critical factors that determine the feasibility of a solution-based protocol for fabrication. Hence, a careful choice of solvents and materials used in adjacent layers is required.

A. M. Gaikwad et al. describe how orthogonal solvents may be determined for solution processed organic semiconductors used in organic field effect transistors (OFETs) (Org. Electr. 2016, 30, 18-29).

A review of recent progress in multilayer solution-processed OLEDs is given by S. Ho et al. in J. Phot. Energy 2015, 5, 1-18.

However, the concept of orthogonal solvents has the following drawbacks: Using orthogonal solvents to prepare successive solution-processed layers in electronic devices is usually achieved by choosing a solvent pair which has a strong difference in polarity (e.g. an non-polar organic solvent and an aqueous solvent) or chemical composition (e.g. a hydrocarbon solvent and a highly fluorinated solvent). This approach necessitates a suitable functionalization of the material which is solution-processed to form the layer, in the first case by attaching polar substituents for the material to be processed from the polar solvent, in the latter case a substantial amount of fluorinated side chains need to be included. This reduces the degrees of freedom for material design and therefore restrains the optimization of the performance of a material in its function in the electronic device. Another drawback of the use of orthogonal solvents is the residual solvent in the thin films: Polar solvent (like water) are known to be detrimental to device performance parameters like the lifetime of the device. Residual solvent in the thin film, especially for the fluorinated solvents also affects the surface energy of thin films which leads to wettability problems during the solution-deposition on top of these layers.

Hence, there is a need to overcome the disadvantages in the prior art and to find new processes for the preparation of OLEDs, wherein organic functional materials are deposited from solution to form functional layers.

Technical Problem and Object of the Invention

Many processes for the preparation of OLEDs have been proposed in the prior art, where adjacent functional layers are formed by depositing organic functional materials from solution. However, the number of process steps and time which are required to form a multi-layered OLED structure from solution is still high. Thus, the preparation of OLEDs by solution based processes needs to be improved.

One object of the present invention is to provide a process for the preparation of an electronic device which allows an efficient and controlled deposition of organic functional materials to form uniform functional layers having good layer properties and performance. It is one object of the present invention to prevent detachment, partial dissolution, redissolution or other impairment of a first functional layer on which a second functional layer is printed on top. A further object of the present invention is to provide a process for the preparation of an electronic device which contains fewer process steps as compared to the prior art and is therefore easier, faster and more cost efficient. Moreover, it is an object of the present invention to provide a process for the preparation of an OLED which shows an improved device performance such as longer device lifetime. Furthermore, it is an object of the present invention to provide an OLED which is obtainable by said process for preparation. Another benefit is the reduction of restraints to material design and synthesis: For the material forming the first layer, no chemical means to reduce its solubility after film formation needs to be included in its molecular structure. Therefore, the scope of potentially useful materials becomes wider.

Solution to Technical Problem

Being aware that the solubility of materials, physical properties of the solvent (surface tension, viscosity, boiling point, etc.), printing conditions (printing technique, air, nitrogen, temperature, etc.) and the parameters for drying and annealing have an important impact on the quality of the layer structure of an OLED and its performance, the present inventors carried out extensive studies.

By doing so, it was surprisingly found that a process for the preparation of an electronic device as defined in claim 1 solves the above-mentioned technical problems and objects of the present invention.

In particular, the present invention relates to a process for the preparation of an electronic device comprising a first functional layer and a second functional layer which form an interface, wherein the process comprises the following process steps:

a1) depositing a first solution containing a first organic functional material and a first solvent on a support;
a2) drying said first solution and optionally annealing said first organic functional material to obtain a first functional layer;
b1) depositing a second solution containing a second organic functional material and a second solvent on the first functional layer; and
b2) drying said second solution and optionally annealing said second organic functional material to obtain a second functional layer;

wherein the absolute solubility of the first organic functional material in the second solvent is in the range from 0.1 to 200 g/L at 25° C. and the absolute solubility of the second organic functional material in the second solvent is >5.0 g/L at 25° C.

Advantageous Effects of the Invention

The inventors have surprisingly found that the above-mentioned process for the preparation of an electronic device allows an efficient and controlled deposition of organic functional materials to form uniform functional layers having good layer properties and performance. In particular, the preparation process according to the present invention allows the formation of well-defined and uniform interfaces without defects between two adjacent functional layers. This is due to a kinetic control which prevents detachment, partial dissolution, redissolution or other impairment of the first functional layer on which the second functional layer is printed on top.

Moreover, it was found that the above-mentioned process for the preparation of an electronic device contains fewer process steps as compared to the prior art and is therefore easier, faster and more cost efficient. Beyond that, OLEDs which are produced by said preparation process show improved device performance such as improved lifetime. In addition there is no need for a cross-linking of the first organic functional material or other treatment to prevent solubility of the first functional layer on which the second organic functional material is deposited to form the second functional layer.

BRIEF DESCRIPTION OF DRAWINGS

FIG. 9 shows the layer structure (stack) of a device which is used in Device Examples 1 to 4. The device contains a substrate, an ITO anode, a hole-injection layer (HIL), a hole-transport layer (HTL), a green-emissive layer (G-EML), a hole-blocking layer (HBL), an electron-transport layer (ETL) and an Al cathode.

DESCRIPTION OF EMBODIMENTS

Figure 1:
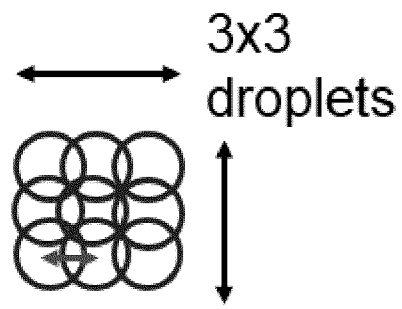
FIG. 1 shows a print pattern depicting the position of the 3×3 droplet matrix to merge together to one drop on the surface.

The present invention relates to a process for the preparation of an electronic device comprising a first functional layer and a second functional layer which form an interface, wherein the process comprises the following process steps:

a1) depositing a first solution containing a first organic functional material and a first solvent on a support;

a2) drying said first solution and optionally annealing said first organic functional material to obtain a first functional layer;

b1) depositing a second solution containing a second organic functional material and a second solvent on the first functional layer; and b2) drying said second solution and optionally annealing said second organic functional material to obtain a second functional layer;

characterized in that the absolute solubility of the first organic functional material in the second solvent is in the range from 0.1 to 200 g/L, preferably from 5.0 to 200 g/L, and more preferably from 5.1 to 200 g/L, at 25° C. and in that the absolute solubility of the second organic functional material in the second solvent is >5.0 g/L, preferably >5.1 g/L, more preferably >5.2 g/L, still more preferably >5.3 g/L, still more preferably >5.4 g/L, still more preferably >5.5 g/L, and most preferably >6.0 g/L, at 25° C.

It is preferred that the absolute solubility of the second organic functional material in the second solvents is ≤1,000 g/L, more preferably ≥500 g/L, still more preferably ≤250 g/L, and most preferably ≤200 g/L, at 25° C.

The absolute solubility of the second organic functional material in the second solvent is determined according to the following procedure which corresponds to ISO 7579:2009.

Preparation of Test Solutions

Prepare six suspensions by taking test portions of the dyestuff to give concentrations of about 40%, 60%, 80%, 100%, 120% and 140% (by mass) of the approximate solubility, If, at the lowest concentration employed, 10% or more of the dyestuff remains undissolved, reduce the concentration until more than 90% of the dyestuff is dissolved. If, at the highest concentration, the residue is less than 25% of the test portion, then increase the mass of the test portion.

Place the required amount of dyestuff in a container and add exactly 20 ml of the solvent, using the pipette. Close the container immediately to prevent loss of solvent. Shake the container using a mechanical shaker at (23±2) ° C. for 3 h. Check that no significant agglomerates are visible.

After shaking the dyestuff and solvent for 3 h, place portions of the suspension in centrifuge tubes and cap each tube. Centrifuge the tubes at (23±2)° C. for 10 min. Check whether the supernatant liquid is clear, for instance by observing whether the supernatant liquid flows smoothly from a pipette tube dipped into it; if not, or in doubt, centrifuge for another 10 min. Decant the supernatant liquid from each tube into a clean, dry container and close securely.

Photometric Determination of the Concentration of the Dissolved Dyestuff

The test solution shall follow the Beer-Lambert law and shall be stable enough to allow repeatable measurements. If the maximum of the absorption peak is not stable during several repeated measurements, another, more stable, peak shall be selected for the calculation or an assessment of the whole spectrum shall be considered.

Preparation of Calibration Solution

The calibration solution shall follow the Beer-Lambert law. If a 2 cm spectrophotometer cell is used, a concentration of about 0.15 g/l for yellow dyestuffs (low absorption) and about 0.02 g/l for blue dyestuffs (high absorption) is normally suitable. Weigh exactly 100.0 mg of dyestuff into a weighing bottle and transfer it to a 100 ml volumetric flask taking care that none is lost. Add 60 ml of solvent and dissolve the dyestuff in an ultrasonic bath Cool down, if necessary, to room temperature, make up to the mark with solvent and shake well. The dyestuff concentration in the solution thus prepared is exactly 1.0 g/l and it now has to be diluted so that it follows the Beer-Lambert law (e.g. to 0.2 g/L or 0.02 g/L).

Owing to the low concentration of dyestuff in the solution, the density of the solution to be diluted is nearly identical to that of the pure solvent, so the mass of solution required for the dilution can be obtained using:

$$m = V \cdot \rho$$

wherein m is the mass, in grams, of solution required;

V is the volume, in milliliters, of solution required;

$\rho$ is the density, in grams per milliliter, of the solvent at 23° C.

Weigh the required mass of solution into a weighing bottle or in a syringe (for volatile solvents) and transfer to a 100 ml volumetric flask. Rinse the weighing bottle or syringe with solvent, adding the rinsings to the solution in the flask, make up to the mark with solvent and shake well.

Preparation and Dilution of Test Solutions

Prepare test solutions as specified and dilute each to a concentration comparable to that of the calibration solution. For example, to obtain a concentration of 0.02 g/L, two dilution steps are required: a) 1 g/L; b) 0.02 g/L. The amount weighed out shall therefore be over 1 g. The use of a 10 mm cell can reduce the number of dilution steps necessary.

Calculate the relative amount of dyestuff in the test solution using:

$$D = \frac{A_s \cdot c_c}{A_c \cdot c_s}$$

wherein

D is the relative amount of dyestuff in the test solution;

$A_s$ is the absorbance of the diluted test solution at the peak maximum chosen;

$c_c$ is the concentration of the dyestuff in the calibration solution, in grams per liter;

$A_c$ is the absorbance of the calibration solution at the peak maximum chosen;

$c_s$ is the final concentration of the supernatant liquid in the diluted test solution in grams per liter.

Using this equation to calculate the ratio between the amount of dyestuff and the volume of solvent in the supernatant solution to determine the concentration of the dyestuff in the solvent, which corresponds to the solubility under the conditions used:

$$S = \frac{c_s \cdot D \cdot \rho}{c_s \cdot (1-D)} = \frac{D \cdot \rho}{1-D}$$

wherein
S is the solubility of the dyestuff, in grams per liter;
p is the density of the solvent, in grams per liter.

The present invention furthermore relates to an OLED which is obtainable by said process for preparation.

Preferred Embodiments

It is preferred that the dissolution rate of the first organic functional material in the second solvent is <0.116 g/(L·min) at 25° C.

The dissolution rate of the first organic functional material in the second solvent is determined according to the following procedure:

The first organic functional material is weighed into a transparent glass flask. The second solvent is then added to the solid mixture at once, the amount is calculated to reach a final concentration of 7 g/L. The mixture is stirred at 600 rpm using a magnetic stirrer at room temperature (25° C.) until complete dissolution, which is judged by visual inspection of the mixture. Towards the end of the dissolution test the mixture is additionally be examined under illumination perpendicular to the line of sight to help identify undissolved particles. The "dissolution time" $t_{DISS}$ is measured using a chronometer, and quantifies the time between addition of the solvent and beginning of stirring until to the disappearance of the last pieces of material into solution. The dissolution rate is determined by dividing 7 g/L by the time until full dissolution was obtained (the "dissolution time").

In a preferred embodiment the second solvent has a layer damage rate (LDR) with respect to the first functional layer of less than 0.066 nm/sec at 25° C.

The layer damage rate (LDR) of the second solvent with respect to the first functional layer is determined according to the following procedure:

The stability of the first functional layer is tested against the second solvent. This second solvent is filled into a solvent stable 10 pl single-use-cartridge of the printer (any drop-on-demand inkjet printer/printhead can be used). The cartridge size determines the droplet volume. In this case a ten picoliter cartridge is used. The printer should be operated in a vibration-free environment and should be leveled. The correct adjustment of printing conditions would be a droplet speed of 4 meters per second. The printing is at best done using a single nozzle only. The substrate with the first functional layer is now placed onto the substrate holder of the printer. The print-pattern is programmed to a have a specific drop volume. The drop on the surface consists of nine small single droplets which are positioned very close together in a 3×3 matrix. After printing the single droplets merge to form a single drop of ninety picoliter drop volume (the volume needs to be kept constant over one set of experiments).

After typically three hundred seconds soaking time the substrate is placed into a vacuum drying chamber to remove the solvent and dry the layer completely. The pressure reaches $1 \cdot 10^{-4}$ mbar after sixty seconds of pumping. The substrate is fully dried for at least ten minutes. After drying the substrate is removed and the damage to the surface is quantified. To quantify the damage to the layer, a tactile measurement such as Profilometry or AFM (Atomic force microscopy) can be done. The difference between lowest and highest point across the profile measurement is determined. The value has the unit nanometer. To determine the layer damage rate, this difference is divided by the soaking time. The unit for the layer damage rate is here nanometer per second [nm/sec]. In general, the soaking time should be in the range of a typical solution processing step.

It is preferred that in the process of the present invention the following equation is satisfied:

$$d(\text{layer1}) > \text{LDR} \cdot t(b1)$$

wherein d(layer1) is the thickness [nm] of the first functional layer; LDR is the layer damage rate [nm/sec] measured at 25° C.; and t(b1) is the time period [sec] in which process step b1 is carried out.

t(b1) is the time period which is required to carry out process step b1. Such time period essentially comprises the time which is required to conduct and conclude the deposition of the second solution on the first functional layer as well as an eventual transfer of the substrate to prepare for process step b2. Unnecessary delays after completion of the deposition of the second solution on the first functional layer are not taken into account for t(b1).

It is preferred that the second solvent dissolves the first organic functional material very slowly when compared to the time period which is required to perform process step b1.

Thus, it is preferred that in the process of the present invention the following equation is satisfied:

$$t_{DISS}(\text{material1}/\text{solvent2}) \geq 2 \cdot t(b1),$$

wherein $t_{DISS}$(material1/solvent2) is the dissolution time [sec] which is required to dissolve 7.00 g of the first organic functional material in 1.00 L of the second solvent at 25° C.; and t(b1) is the time period [sec] in which process step b1 is carried out.

The dissolution time $t_{DISS}$(material1/solvent2) is determined as described above in the procedure for determining the dissolution rate of the first organic functional material in the second solvent.

In a preferred embodiment of the present invention the first organic functional material is a non-crosslinkable polymer. It is further preferred that the first organic functional material is a non-crosslinkable polymer which is a hole-transport material. Preferred hole-transport materials are selected from the list consisting of polysilanes, aniline copolymers, thiophene oligomers, polythiophenes, poly(N-vinyl)carbazole, polypyrroles, polyanilines, polytriarylamines and mixtures thereof.

The content of the second organic functional material in the second solution is preferably in the range from 0.001 to 20 weight-%, more preferably in the range from 0.01 to 10 weight-% and most preferably in the range from 0.1 to 5 weight-%, based on the total weight of the second solution.

In a preferred embodiment of the present invention the second organic functional material is a light-emitting material. Preferred light emitting materials are fluorescent or phosphorescent emitters selected from the list consisting of stilbene, stilbenamine, styrylamine, coumarine, rubrene, rhodamine, thiazole, thiadiazole, cyanine, thiophene, paraphenylene, perylene, phtalocyanine, porphyrin, ketone, quinoline, imine, anthracene, pyrene and phosphorescent metal complexes, preferably containing Ir, Ru, Pd, Pt, Os or Re, and mixtures thereof. Two, three or more of the aforementioned preferred light emitting materials may be used in combination to form mixtures.

Preferably, process step b1) is carried out in a time period of less than 600 sec, more preferably in a time period of less than 300 sec.

Preferably, process step b1) is carried out at a temperature in the range from 5 to 50° C., more preferably in the range from 10 to 35° C.

Preferably, process step b1) is carried out by a printing process or a coating process. More preferably, process step b1) is carried out by an inkjet printing process.

The first solvent to be used in the process according to the present invention is not particularly limited. As first solvent, any solvent may be used which allows sufficient solubility of the first organic functional material. The first solvent may be a single solvent or two or more solvents. In a preferred embodiment the first solvent contains, one, two or more organic solvents. Suitable solvents which may be used as first solvent are organic solvents such as ketones, substituted and non-substituted aromatic, alicyclic or linear ethers, esters, amides (e.g. di-$C_{1-2}$-alkylformamides), aromatic amines, sulfur compounds, nitro compounds, hydrocarbons, halogenated hydrocarbons (e.g. chlorinated hydrocarbons), aromatic or heteroaromatic hydrocarbons (e.g. naphthalene derivatives, pyrrolidinones, pyridines, pyrazines), indane derivatives and halogenated aromatic or heteroaromatic hydrocarbons. In a preferred embodiment the first solvent consists of one, two or more organic solvents.

The second solvent to be used in the process according to the present invention can be freely chosen so that the absolute solubility of the first organic functional material in the second solvent is in the range from 0.1 to 200 g/L at 25° C. and in that the absolute solubility of the second organic functional material in the second solvent is in the range from 0.1 to 200 g/L at 25° C. Preferably, the absolute solubility of the first organic functional material in the second solvent is in the range from 5.0 to 200 g/L at 25° C., and more preferably from 5.1 to 200 g/L at 25° C., and the absolute solubility of the second organic functional material in the second solvent is in the range from 5.0 to 200 g/L at 25° C., and more preferably from 5.1 to 200 g/L at 25° C. Most preferably, the absolute solubility of the first organic functional material in the second solvent is in the range from 5.1 to 150 g/L at 25° C. and the absolute solubility of the second organic functional material in the second solvent is in the range from 5.1 to 150 g/L at 25° C. The absolute solubility as used in the present invention is determined according to the standard procedure ISO 7579:2009. ISO 7579:2009 specifies two methods for determining the solubility of dyestuffs in organic solvents. They are applicable to dyestuffs that do not change chemically under the influence of the solvent and are stable and non-volatile under the specified drying conditions. For volatile solvents (boiling point <120° C.), the gravimetric procedure is recommended and, for less volatile solvents (boiling point >120° C.), the photometric procedure is recommended. The second solvent may be a single solvent or two or more solvents. In a preferred embodiment the second solvent consists of one, two or more organic solvents.

In a preferred embodiment the first solvent and the second solvent are the same.

Preferably, the second solvent is an organic solvent having 8 to 14 carbon atoms and 1 to 3 oxygen and/or nitrogen atoms which contains one aromatic six-membered carbocyclic ring system or one or two aliphatic five- or six-membered carbocyclic ring systems.

In a preferred embodiment of the present invention the first solvent and the second solvent are liquids at 25° C. and 760 mm Hg.

Preferably, the second solvent is an organic solvent having a boiling point in the range from 195 to 350° C., more preferably in the range from 210 to 300° C. and most preferably in the range from 220 to 290° C., at 760 mm Hg.

DETAILED DESCRIPTION

The organic electroluminescent device which is prepared according to the process of the present invention comprises a layered stack structure with two or more functional layers, wherein a first functional layer and a second functional layer are adjacent and together form an interface. The first functional layer and the second functional layer are selected independently from an electron-injection layer, electron-transport layer, electron-blocking layer, hole-injection layer, hole-transport layer, hole-blocking layer and light emitting layer. Usually, the first functional layer and the second functional layer are not identical which means that they have either a different function or they contain different organic functional materials. Such organic functional materials are e.g. electron-injection materials, electron-transport materials, electron-blocking materials, hole-injection materials, hole-transport materials, hole-blocking materials, light emitting materials such as fluorescent emitters or phosphorescent emitters, host materials, matrix materials, exciton-blocking materials, n-dopants, p-dopants and wide-band-gap materials. A functional layer may contain one or more of the aforementioned organic functional materials.

It is preferred that the first organic functional material is a non-crosslinkable polymer. More preferably, the first organic functional material is a non-crosslinkable polymer which is a hole-transport material. Preferred hole-transport materials are selected from the list consisting of polysilanes, aniline copolymers, thiophene oligomers, polythiophenes, poly(N-vinyl)carbazole, polypyrroles, polyanilines, polytriarylamines and mixtures thereof.

It is preferred that the second organic functional material is a light-emitting material. Preferred light emitting materials are fluorescent or phosphorescent emitters selected from the list consisting of stilbene, stilbenamine, styrylamine, coumarine, rubrene, rhodamine, thiazole, thiadiazole, cyanine, thiophene, paraphenylene, perylene, phtalocyanine, porphyrin, ketone, quinoline, imine, anthracene, pyrene and phosphorescent metal complexes, preferably containing Ir, Ru, Pd, Pt, Os or Re, and mixtures thereof. Two, three or more of the aforementioned preferred light emitting materials may be used in combination to form mixtures.

In process step a1) a first solution containing a first organic functional material and a first solvent is deposited on a support. The support on which the first solution is deposited may be any substrate which may be used for an OLED. Beyond that, the support may be an electrode (e.g. an anode or cathode) or any functional layer to be used in an OLED such as an electron-injection layer, electron-transport layer, electron-blocking layer, hole-injection layer, hole-transport layer, hole-blocking layer or light emitting layer. The support forms the basis on which the first solution is deposited in process step a1).

In process step a2) the first solution which is deposited on the support in process step a1) is dried and optionally annealed. The drying is carried out in order to remove the solvent from the first solution which is deposited on the support in process step a1). The drying in process step a2) is preferably carried out at relatively low temperature such as room temperature (25° C.) and over a relatively long period in order to avoid bubble formation and to obtain a uniform functional layer. However, it may be also possible to carry out the drying in process step a2) at elevated temperature, preferably in the range from 25 to 100° C., more preferably in the range from 25 to 60° C. The drying in process step a2) is preferably carried out under reduced pressure, more preferably at a pressure in the range from $10^{-6}$ mbar to 1 bar, particularly preferably in the range from $10^{-6}$ mbar to 100 mbar and most preferably in the range from $10^{-6}$ mbar to 10 mbar. The duration of the drying in process step a2) depends on the degree of drying to be achieved. The drying in process step a2) is preferably carried out within a time period of 1 to 60 min, more preferably within a time period of 1 to 30 min.

The drying in process step a2) may be optionally followed by an annealing. The optional annealing in process step a2) is preferably carried out at an elevated temperature in the range from 80 to 300° C., more preferably at a temperature in the range from 150 to 200° C. and most preferably at a temperature in the range from 160 to 220° C. The optional annealing in process step a2) is preferably carried out under reduced pressure, more preferably at a pressure in the range from 1 to 1013 mbar. The optional annealing in process step a2) is preferably carried out within a time period of 1 to 60 min, more preferably within a time period of 10 to 60 min.

In a preferred embodiment the drying and annealing are combined and performed as a single step in process step a2). In this case the drying and annealing conditions are identical. In a particularly preferred embodiment the temperature, pressure and time conditions, which are disclosed for drying, are used for drying and annealing. In an alternative particularly preferred embodiment the temperature, pressure and time conditions, which are disclosed for annealing, are used for drying and annealing.

It is preferred that the drying and optional annealing in process step a2) is carried out within a total time period of 1 to 90 min, more preferably within a total time period of 1 to 60 min. This shall apply to all cases, regardless of whether the drying and optional annealing are performed at identical or different conditions.

In process step b1) a second solution containing a second organic functional material and a second solvent is deposited on the first functional layer obtained in process step a2). It is preferred that process step b1) is carried out at a temperature in the range from 5 to 50° C., more preferably at a temperature in the range from 10 to 35° C. It is preferred that process step b1) is carried out in a timer period of less than 10 min, more preferably in a time period of less than 5 min.

In process step b2) the second solution which is deposited on the first functional layer in process step b1) is dried and optionally annealed. The drying in process step b2) is preferably carried out at relatively low temperature such as room temperature (25° C.) and over a relatively long period in order to avoid bubble formation and to obtain a uniform functional layer. However, it may be also possible to carry out the drying in process step b2) at elevated temperature, preferably in the range from 25 to 100° C., more preferably in the range from 25 to 60° C. The drying in process step b2) is preferably carried out under reduced pressure, more preferably at a pressure in the range from $10^{-6}$ mbar to 1 bar, particularly preferably in the range from $10^{-6}$ mbar to 100 mbar and most preferably in the range from $10^{-6}$ mbar to 10 mbar. The duration of the drying in process step b2) depends on the degree of drying to be achieved. The drying in process step b2) is preferably carried out within a time period of 1 to 60 min, more preferably within a time period of 1 to 30 min.

The drying in process step b2) may be optionally followed by an annealing. The optional annealing in process step b2) is preferably carried out at an elevated temperature in the range from 80 to 300° C., more preferably at a temperature in the range from 150 to 200° C. and most preferably at a temperature in the range from 160 to 220° C. The optional annealing in process step b2) is preferably carried out under reduced pressure, more preferably at a pressure in the range from 1 to 1013 mbar. The optional annealing in process step b2) is preferably carried out within a time period of 1 to 60 min, more preferably within a time period of 10 to 60 min.

It is particularly preferred that the drying and annealing are combined and performed as a single step in process step b2). In this case the drying and annealing conditions are identical. In a preferred embodiment the temperature, pressure and time conditions which are disclosed for drying are used for drying and annealing. In a preferred alternative embodiment the temperature, pressure and time conditions which are disclosed for annealing are used for drying and annealing.

It is preferred that the drying and optional annealing in process step b2) is carried out within a total time period of 1 to 90 min, more preferably within a total time period of 1 to 60 min. This shall apply to all cases, regardless of whether the drying and optional annealing are performed at identical or different conditions.

The first and second solution may be deposited as liquid compositions using any suitable solution processing techniques known in the art. For example, the solution can be deposited using a printing process, such as e.g. inkjet printing, nozzle printing, offset printing, transfer printing, relief printing, gravure printing, rotary printing, flexographic printing or screen printing; or for example, using a coating process, such as e.g. spray coating, spin coating, slot coating, curtain coating, flood coating, roller coating or dip coating.

In a preferred embodiment of the present invention the depositions in process steps a1) and b1) are carried out by the same solution processing technique, more preferably by a printing process or a coating process and most preferably by an inkjet printing process.

Examples of the most preferred second solvents, their boiling points (BP) and physical state at room temperature are shown in Table 1 below.

TABLE 1

Most preferred solvents to be used as second solvent, their boiling points (BP) and their physical state at room temperature (25° C.).

| Solvent | BP (° C.) (760 mm Hg) | Physical State at RT |
|---|---|---|
| 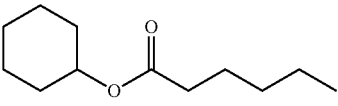<br>Cylcohexl hexanoate<br>CAS 6243-10-3 | 255 | Liquid at RT |
| 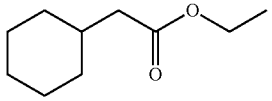<br>Ethyl cyclohexlacetate<br>CAS 5452-75-5 | 211 | Liquid at RT |

TABLE 1-continued

Most preferred solvents to be used as second solvent, their boiling points (BP) and their physical state at room temperature (25° C.).

| Solvent | BP (° C.) (760 mm Hg) | Physical State at RT |
|---|---|---|
| 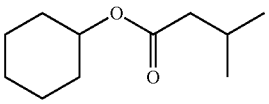<br>Cyclohexyl isovalerate<br>CAS 7774-44-9 | 223 | Liquid at RT |
| 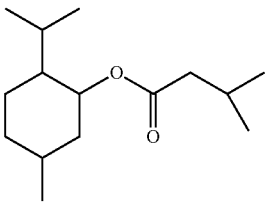<br>Menthyl isovalerate<br>CAS 16409-46-4 | 260 | Liquid at RT |
| 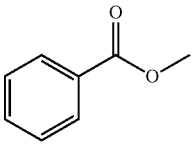<br>Methyl benzoate<br>CAS 93-58-3 | 199 | Liquid at RT |
| 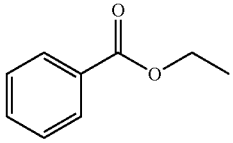<br>Ethyl benzoate<br>CAS 93-89-0 | 212 | Liquid at RT |
| 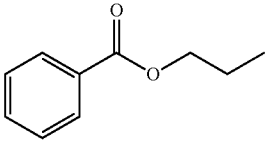<br>Propylbenzoate<br>CAS 2315-68-6 | 229 | Liquid at RT |
| 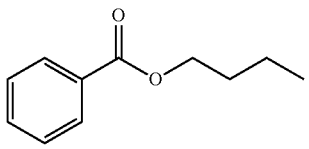<br>Butylbenzoate<br>CAS 136-60-7 | 250 | Liquid at RT |
| 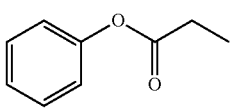<br>CAS: 637-27-4<br>Phenyl propionate | 215 | Liquid at RT |
| 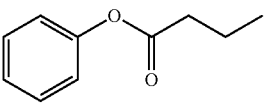<br>CAS: 4346-18-3<br>Butyric acid phenyl ester | 229 | Liquid at RT |
| 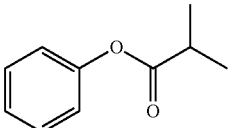<br>CAS: 36438-55-8<br>Isobutyric acid m-tolyl ester | 245 | Liquid at RT |
| 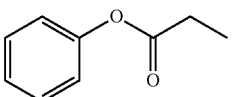<br>CAS: 51233-77-3<br>Propionic acid m-tolyl ester | 231 | Liquid at RT |
| 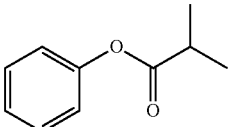<br>CAS: 20279-29-2<br>Isobutyric acid phenyl ester | 224 | Liquid at RT |
| 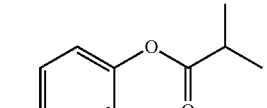<br>CAS: 103-93-5<br>Isobutyric acid p-tolyl ester | 237 | Liquid at RT |
| 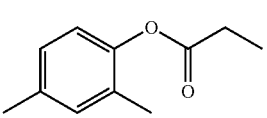<br>CAS: 51233-78-4<br>2,4-Xylyl propanoate | 246 | Liquid at RT |
| 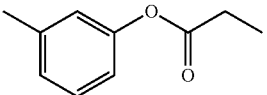<br>CAS: 51233-82-0<br>3,5-Xylyl propanoate | 243 | Liquid at RT |

TABLE 1-continued

Most preferred solvents to be used as second solvent, their boiling points (BP) and their physical state at room temperature (25° C.).

| Solvent | BP (° C.) (760 mm Hg) | Physical State at RT |
|---|---|---|
| CAS: 859078-50-5<br>Propionic acid 4-ethyl-2-methyl-phenyl ester | 254 | Liquid at RT |
| CAS: 448251-53-4<br>Propionic acid 4-(methylethyl)-phenyl ester | 260 | Liquid at RT |
| CAS: 67001-64-3<br>Propionic acid 3-methoxy-phenyl esther | 248 | Liquid at RT |
| CAS: 140-26-1<br>Phenethyl isovalerate | 268 | Liquid at RT |
| CAS: 6290-37-5<br>Phenethyl hexanoate | 263 | Liquid at RT |
| CAS: 7335-26-4<br>Ethyl 2-methoxybenzoate | 220 | Liquid at RT |
| CAS: 10529-22-0<br>Ethyl 3-methoxybenzoate | 273 | Liquid at RT |
| CAS: 94-30-4<br>Ethyl 4-methoxybenzoate | 263 | Liquid at RT |
| CAS 119-60-8<br>Dicyclohexyl methanone | 266 | Liquid at RT |
| CAS 17773-63-6<br>Cyclohexylcyclopentyl methanone | 257 | Liquid at RT |
| CAS 17610-48-9<br>Dicyclopentyl methanone | 239 | Liquid at RT |
| CAS 5665-83-8<br>Cyclohexyl hexanone | 251 | Liquid at RT |
| CAS 613-29-6<br>Dibutylaniline | 269-270 | Liquid at RT |

TABLE 1-continued

Most preferred solvents to be used as second solvent, their boiling points (BP) and their physical state at room temperature (25° C.).

| Solvent | BP (° C.) (760 mm Hg) | Physical State at RT |
|---|---|---|
| 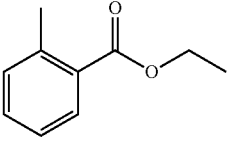 CAS 87-24-1 Ethyl o-toluate | 227 | Liquid at RT |
| 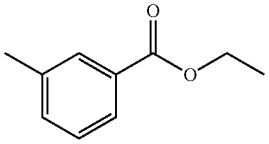 CAS 120-33-2 Ethyl m-toluate | 234 | Liquid at RT |
| 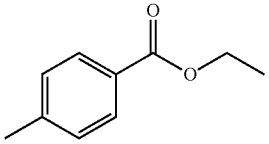 CAS 94-08-6 Ethyl p-toluate | 232 | Liquid at RT |
| 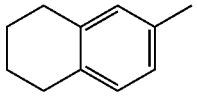 CAS 1680-51-9 6-methyltetralin | 229 | Liquid at RT |
| 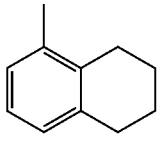 CAS 2809-64-5 5-methyltetralin | 234 | Liquid at RT |
| 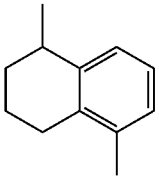 CAS 21564-91-0 1,5-dimethyltetralin | 239 | — |
| 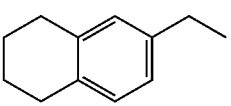 CAS 22531-20-0 6-ethyltetralin | 244 | — |
| 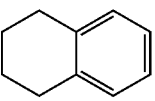 CAS 119-64-2 Tetralin | 207 | Liquid at RT |
| 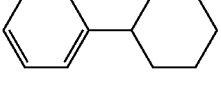 CAS 827-52-1 Cyclohexylbenze | 239 | Liquid at RT |

Preferably, the second solvent is liquid at room temperature (25° C.) and standard pressure (760 mm Hg) which means that it has a melting point of 25° C. or below at 760 mm Hg.

Preferably, the second solvent is an organic solvent having a boiling point in the range from 195 to 350° C., more preferably in the range from 195 to 275° C., even more preferably in the range from 210 to 300° C., even more preferably in the range from 210 to 270° C., even more preferably in the range from 220 to 290° C. and most preferably in the range from 220 to 260° C., wherein the boiling point is given at 760 mm Hg.

Preferably, the first solution has a surface tension in the range from 1 to 70 mN/m, preferably in the range from 10 to 50 mN/m and more preferably in the range from 20 to 40 mN/m.

Preferably, the second solution has a surface tension in the range from 1 to 70 mN/m, preferably in the range from 10 to 50 mN/m and more preferably in the range from 20 to 40 mN/m.

The surface tension of the solutions used in the present invention is measured by pendant drop characterization which is an optical method. This measurement technique dispenses a drop from a needle in a bulk gaseous phase. The shape of the drop results from the relationship between the surface tension, gravity and density differences. Using the pendant drop method, the surface tension is calculated from the shadow image of a pendant drop using drops shape analysis. A commonly used and commercially available high precision drop shape analysis tool, namely the DSA100 from Krüss GmbH, was used to perform all surface tension measurements. The surface tension is determined by the software "DSA4" in accordance with DIN 55660-1. All measurements were performed at ambient temperature which is in the range between 22° C. and 24° C. The standard operating procedure includes the determination of the surface tension of each formulation using a fresh disposable drop dispensing system (syringe and needle). Each drop is measured over the duration of one minute with sixty measurements which are later on averaged. For each formulation three drops are measured. The final value is averaged over said measurements. The tool is regularly cross-checked against various liquids having well known surface tension.

Preferably, the first solution has a viscosity in the range from 0.8 to 50 mPas, more preferably in the range from 1 to 40 mPas, more preferably in the range from 2 to 20 mPas and most preferably in the range from 2 to 15 mPas.

Preferably, the second solution has a viscosity in the range from 0.8 to 50 mPas, more preferably in the range from 1 to 40 mPas, more preferably in the range from 2 to 20 mPas and most preferably in the range from 2 to 15 mPas.

The viscosity of the solutions used in the present invention is measured with a 1° cone-plate rotational rheometer of the type Haake MARS III Rheometer (Thermo Scientific). The equipment allows a precise control of the temperature and sheer rate. The measurement of the viscosity is carried out at a temperature of 23.4° C. (+/−0.2° C.) and a sheer rate of 500 s$^{-1}$. Each sample is measured three times and the obtained measured values are averaged. The measurement and processing of data is carried out using the software "Haake RheoWin Job Manager" according to DIN 1342-2. The Haake MARS III Rheometer is regularly calibrated by Thermo Scientific and the tool received a certified standard factory calibration before first use.

Preferably, the first solvent is selected from the group consisting of substituted and non-substituted aromatic or non-aromatic, cyclic or linear esters such as ethyl benzoate, butyl benzoate; substituted and non-substituted aromatic or linear ethers such as 3-phenoxytoluene or anisole derivatives; substituted or non-substituted arene derivatives such as xylene; indane derivatives such as hexamethylindane; substituted and non-substituted aromatic or linear ketones; substituted and non-substituted heterocycles such as pyrrolidinones, pyridines; fluorinated or chlorinated hydrocarbons; and linear or cyclic siloxanes.

Particularly preferred first solvents are selected from 1,2,3,4-tetramethylbenzene, 1,2,3,5-tetramethylbenzene, 1,2,3-trimethylbenzene, 1,2,4,5-tetramethylbenzene, 1,2,4-trichlorobenzene, 1,2,4-trimethylbenzene, 1,2-dihydronaphthalene, 1,2-dimethylnaphthalene, 1,3-benzodioxolane, 1,3-diisopropylbenzene, 1,3-dimethylnaphthalene, 1,4-benzodioxane, 1,4-diisopropylbenzene, 1,4-dimethylnaphthalene, 1,5-dimethyltetralin, 1-benzothiophene, 1-bromonaphthalene, 1-chloromethyl-naphthalene, 1-ethylnaphthalene, 1-methoxynaphthalene, 1-methylnaphthalene, 1-methylindole, 2,3-benzofuran, 2,3-dihydrobenzofuran, 2,3-dimethylanisole, 2,4-dimethylanisole, 2,5-dimethylanisole, 2,6-dimethylanisole, 2,6-dimethylnaphthalene, 2-bromo-3-bromomethylnaphthalene, 2-bromomethylnaphthalene, 2-bromonaphthalene, 2-ethoxynaphthalene, 2-ethylnaphthalene, 2-isopropylanisole, 2-methylanisole, 2-methylindole, 3,4-dimethylanisole, 3,5-dimethylanisole, 3-bromoquinoline, 3-methylanisole, 4-methylanisole, 5-decanolide, 5-methoxyindane, 5-methoxyindole, 5-tert-butyl-m-xylene, 6-methylquinoline, 8-methylquinoline, acetophenone, anisole, benzonitrile, benzothiazole, benzyl acetate, bromobenzene, butyl benzoate, butyl phenyl ether, cyclohexylbenzene, cyclohexyl hexanoate, decahydronaphthol, dimethoxytoluene, 3-phenoxytoluene, diphenyl ether, propiophenone, ethylbenzene, ethyl benzoate, γ-terpinene, menthyl isovalerate, hexylbenzene, indane, hexamethylindane, indene, isochroman, cumene, m-cymene, mesitylene, methyl benzoate, o-, m-, p-xylene, propyl benzoate, propylbenzene, o-dichlorobenzene, pentylbenzene, phenetol, ethoxybenzene, phenyl acetate, p-cymene, propiophenone, sec-butylbenzene, t-butylbenzene, thiophene, toluene, veratrol, monochlorobenzene, o-dichlorobenzene, pyridine, pyrazine, pyrimidine, pyrrolidinone, morpholine, dimethylacetamide, dimethyl sulfoxide, decaline and/or mixtures of these compounds.

The content of the first organic functional material in the first solution is preferably in the range from 0.001 to 20 weight-%, more preferably in the range from 0.01 to 10 weight-% and most preferably in the range from 0.1 to 5 weight-%, based on the total weight of the first solution.

The content of the second organic functional material in the second solution is preferably in the range from 0.001 to 20 weight-%, more preferably in the range from 0.01 to 10 weight-% and most preferably in the range from 0.1 to 5 weight-%, based on the total weight of the second solution.

Such organic functional materials are e.g. electron-injection materials, electron-transport materials, electron-blocking materials, hole-injection materials, hole-transport materials, hole-blocking materials, light emitting materials such as fluorescent emitters or phosphorescent emitters, host materials, matrix materials, exciton-blocking materials, n-dopants, p-dopants and wide-band-gap materials. A functional layer may contain one or more of the aforementioned organic functional materials.

It is preferred that the first organic functional material is a non-crosslinkable polymer. More preferably, the first organic functional material is a non-crosslinkable polymer which is a hole-transport material. Preferred hole-transport materials are selected from the list consisting of polysilanes, aniline copolymers, thiophene oligomers, polythiophenes, poly(N-vinyl)carbazole, polypyrroles, polyanilines, polytriarylamines and mixtures thereof.

It is preferred that the second organic functional material is a light-emitting material. Preferred light emitting materials are fluorescent or phosphorescent emitters selected from the list consisting of stilbene, stilbenamine, styrylamine, coumarine, rubrene, rhodamine, thiazole, thiadiazole, cyanine, thiophene, paraphenylene, perylene, phtalocyanine, porphyrin, ketone, quinoline, imine, anthracene, pyrene and phosphorescent metal complexes, preferably containing Ir, Ru, Pd, Pt, Os or Re, and mixtures thereof. Two, three or more of the aforementioned preferred light emitting materials may be used in combination to form mixtures.

The solutions used as first or second solution in the present invention comprise at least one organic functional material which can be employed for the production of functional layers of electronic devices such as e.g. organic electroluminescent devices (OLEDs). Organic functional materials are generally the organic materials which are introduced between the anode and the cathode of an electronic device. The organic functional material is preferably selected from organic conductors, organic semiconductors, organic fluorescent compounds, organic phosphorescent compounds, organic light-absorbent compounds, organic light-sensitive compounds, organic photosensitisation agents and other organic photoactive compounds, selected from organometallic complexes of transition metals, rare earths, lanthanides and actinides. Particularly preferred organic functional materials are e.g. electron-injection materials, electron-transport materials, electron-blocking materials, hole-injection materials, hole-transport materials, hole-blocking materials, light emitting materials such as fluorescent emitters or phosphorescent emitters, host materials, matrix materials, exciton-blocking materials, n-dopants, p-dopants and wide-band-gap materials.

Preferred embodiments of organic functional materials are disclosed in detail in WO 2011/076314 A1 which is hereby incorporated into the present application by way of reference.

The organic functional material can be a compound having a low molecular weight, a polymer, an oligomer or a dendrimer, where the organic functional material may also be in the form of a mixture.

In a preferred embodiment the first solution comprises two or more different organic functional materials as first organic functional material. Such two or more different organic functional materials, which make up the first organic functional material, may be either low molecular weight molecules or polymers or a mixture of at least one low molecular weight molecule and at least one polymer. In a particular preferred embodiment the first solution comprises two different organic functional materials having a low molecular weight, one organic functional material having a low molecular weight and one organic functional material being a polymer or two organic functional materials being polymers as first organic functional material.

In a preferred embodiment the second solution comprises two or more different organic functional materials as second organic functional material. Such two or more organic functional materials, which make up the second organic functional material, may be either low molecular weight molecules or polymers or a mixture of at least one low molecular weight molecule and at least one polymer. In a particular preferred embodiment the second solution comprises two different organic functional materials having a low molecular weight, one organic functional material having a low molecular weight and one organic functional material being a polymer or two organic functional materials being polymers as second organic functional material.

Preferably, organic functional materials having a low molecular weight have a molecular weight $M_w$ of ≤3,000 g/mol, particularly preferably ≤2,000 g/mol and especially preferably ≤1,800 g/mol.

Preferably, organic functional materials being a polymer have a molecular weight $M_w$ of ≥10,000 g/mol, particularly preferably ≥20,000 g/mol and especially preferably ≥50,000 g/mol. The molecular weight $M_w$ of the polymers here is preferably in the range from 10,000 to 2,000,000 g/mol, particularly preferably in the range from 20,000 to 1,000,000 g/mol and very particularly preferably in the range from 50,000 to 300,000 g/mol. The molecular weight $M_w$ is determined by means of GPC (=gel permeation chromatography) against an internal polystyrene standard.

Organic functional materials are frequently described by the properties of their frontier orbitals, which are described in greater detail below. Molecular orbitals, in particular also the highest occupied molecular orbital (HOMO) and the lowest unoccupied molecular orbital (LUMO), their energy levels and the energy of the lowest triplet state $T_1$ or of the lowest excited singlet state $S_1$ of the materials are determined via quantum-chemical calculations.

In order to calculate organic substances without metals, firstly a geometry optimisation is carried out using the "Ground State/Semi-empirical/Default Spin/AM1/Charge 0/Spin Singlet" method. An energy calculation is subsequently carried out on the basis of the optimised geometry. The "TD-SCF/DFT/Default Spin/B3PW91" method with the "6-31G(d)" base set (charge 0, spin singlet) is used here. For metal-containing compounds, the geometry is optimised via the "Ground State/Hartree-Fock/Default Spin/LanL2 MB/Charge 0/Spin Singlet" method. The energy calculation is carried out analogously to the above-described method for the organic substances, with the difference that the "LanL2DZ" base set is used for the metal atom and the "6-31G(d)" base set is used for the ligands. The energy calculation gives the HOMO energy level HEh or LUMO energy level LEh in hartree units. The HOMO and LUMO energy levels in electron volts calibrated with reference to cyclic voltammetry measurements are determined therefrom as follows:

HOMO(eV)=((*HEh*\*27.212)−0.9899)/1.1206

LUMO(eV)=((*LEh*\*27.212)−2.0041)/1.385

For the purposes of this application, these values are to be regarded as HOMO and LUMO energy levels respectively of the materials.

The lowest triplet state $T_1$ is defined as the energy of the triplet state having the lowest energy which arises from the quantum-chemical calculation described.

The lowest excited singlet state $S_1$ is defined as the energy of the excited singlet state having the lowest energy which arises from the quantum-chemical calculation described.

The method described herein is independent of the software package used and always gives the same results. Examples of frequently used programs for this purpose are "Gaussian09 W" (Gaussian Inc.) and Q-Chem 4.1 (Q-Chem, Inc.).

Materials having hole-injection properties, also called hole-injection materials herein, simplify or facilitate the transfer of holes, i.e. positive charges, from the anode into an organic layer. In general, a hole-injection material has an HOMO level which is in the region of or above the Fermi level of the anode.

Compounds having hole-transport properties, also called hole-transport materials herein, are capable of transporting holes, i.e. positive charges, which are generally injected from the anode or an adjacent layer, for example a hole-injection layer. A hole-transport material generally has a high HOMO level of preferably at least −5.4 eV. Depending on the structure of an electronic device, it may also be possible to employ a hole-transport material as hole-injection material.

The preferred compounds which have hole-injection and/or hole-transport properties include, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O—, S— or N— containing heterocycles having a high HOMO (HOMO=highest occupied molecular orbital). Polymers such as PEDOT:PSS can also be used as compounds with hole-injection and/or hole-transport properties.

As compounds which have hole-injection and/or hole-transport properties, particular mention may be made of phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP-A-56-46234), polycyclic aromatic compounds (EP 1009041), polyarylalkane derivatives (U.S. Pat. No. 3,615,402), fluorenone derivatives (JP-A-54-110837), hydrazone derivatives (U.S. Pat. No. 3,717, 462), acylhydrazones, stilbene derivatives (JP-A-61-210363), silazane derivatives (U.S. Pat. No. 4,950,950), polysilanes (JP-A-2-204996), aniline copolymers (JP-A-2-282263), thiophene oligomers (JP Heisei 1 (1989) 211399), polythiophenes, poly(N-vinylcarbazole) (PVK), polypyrroles, polyanilines and other electrically conducting macromole-cules, porphyrin compounds (JP-A-63-2956965, U.S. Pat. No. 4,720,432), aromatic dimethylidene-type compounds, carbazole compounds, such as, for example, CDBP, CBP, mCP, aromatic tertiary amine and styrylamine compounds (U.S. Pat. No. 4,127,412), such as, for example, triphenylamines of the benzidine type, triphenylamines of the styrylamine type and triphenylamines of the diamine type. It is also possible to use arylamine dendrimers (JP Heisei 8 (1996) 193191), monomeric triarylamines (U.S. Pat. No. 3,180,730), triarylamines containing one or more vinyl radicals and/or at least one functional group containing active hydrogen (U.S. Pat. Nos. 3,567,450 and 3,658,520), or tetraaryldiamines (the two tertiary amine units are connected via an aryl group). More triarylamino groups may also be present in the molecule. Phthalocyanine derivatives, naphthalocyanine derivatives, butadiene derivatives and quinoline derivatives, such as, for example, dipyrazino[2,3-f:2',3'-h]quinoxalinehexacarbo-nitrile, are also suitable.

Preference is given to aromatic tertiary amines containing at least two tertiary amine units (US 2008/0102311 A1, U.S. Pat. Nos. 4,720,432 and 5,061,569), such as, for example, NPD (α-NPD=4,4'-bis[N-(1-naphthyl)-N-phenylamino]biphenyl) (U.S. Pat. No. 5,061,569), TPD 232 (=N,N'-bis-(N,N'-diphenyl-4-aminophenyl)-N,N-diphenyl-4,4'-diamino-1,1'-biphenyl) or MTDATA (MTDATA or m-MTDATA=4,4',4''-tris[3-methylphenyl)phenylamino]-triphenylamine) (JP-A-4-308688), TBDB (=N,N,N',N'-tetra(4-biphenyl)-diaminobiphenylene), TAPC(=1,1-bis(4-di-p-tolylaminophenyl)cyclo-hexane), TAPPP (=1,1-bis(4-di-p-tolylaminophenyl)-3-phenylpropane), BDTAPVB (=1,4-bis[2-[4-[N,N-di(p-tolyl)amino]phenyl]vinyl]benzene), TTB (=N,N,N',N'-tetra-p-tolyl-4,4'-diaminobiphenyl), TPD (=4,4'-bis[N-3-methylphenyl]-N-phenylamino)biphenyl), N,N,N',N'-tetraphenyl-4,4'-diamino-1,1',4',1'',4'',1'''-quaterphenyl, likewise tertiary amines containing carbazole units, such as, for example, TCTA (=4-(9H-carbazol-9-yl)-N,N-bis[4-(9H-carbazol-9-yl)phenyl]benzenamine). Preference is likewise given to hexa-azatriphenylene compounds in accordance with US 2007/0092755 A1 and phthalocyanine derivatives (for example H₂Pc, CuPc (=copper phthalocyanine), CoPc, NiPc, ZnPc, PdPc, FePc, MnPc, ClAlPc, ClGaPc, ClInPc, ClSnPc, Cl₂SiPc, (HO)AlPc, (HO)GaPc, VOPc, TiOPc, MoOPc, GaPc-O-GaPc).

Particular preference is given to the following triarylamine compounds of the formulae (TA-1) to (TA-12), which are disclosed in the documents EP 1162193 B1, EP 650 955 B1, Synth. Metals 1997, 91(1-3), 209, DE 19646119 A1, WO 2006/122630 A1, EP 1 860 097 A1, EP 1834945 A1, JP 08053397 A, U.S. Pat. No. 6,251,531 B1, US 2005/0221124, JP 08292586 A, U.S. Pat. No. 7,399,537 B2, US 2006/0061265 A1, EP 1 661 888 and WO 2009/041635. The said compounds of the formulae (TA-1) to (TA-12) may also be substituted:

formula TA-1

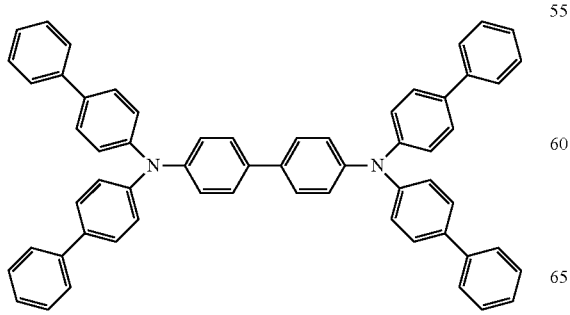

formula TA-2

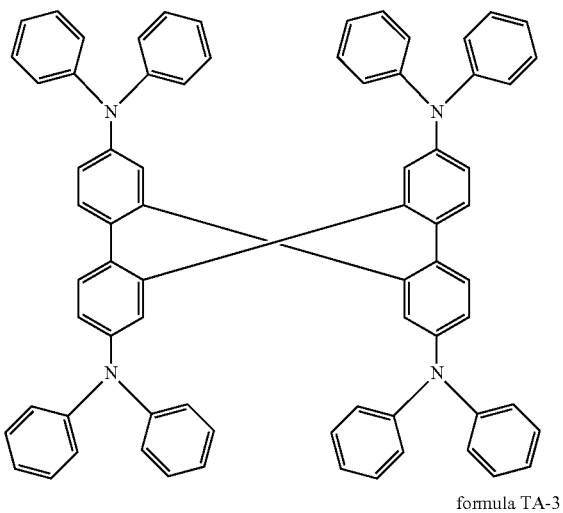

formula TA-3

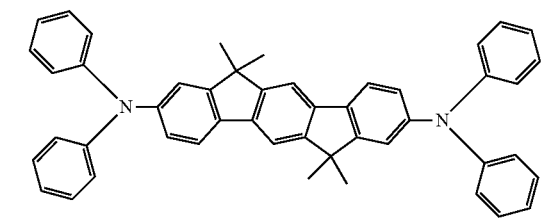

formula TA-4

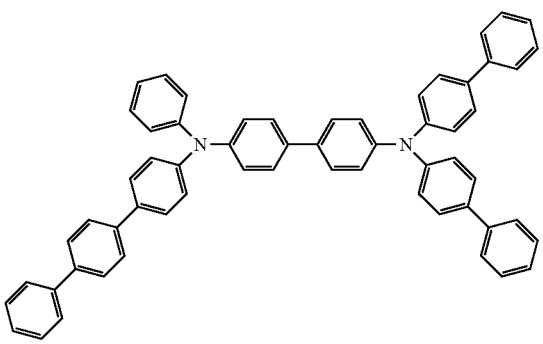

formula TA-5

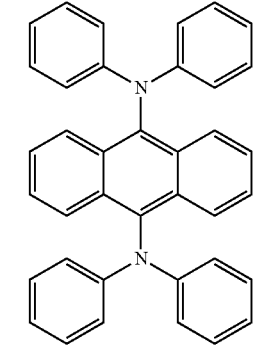

-continued formula TA-6

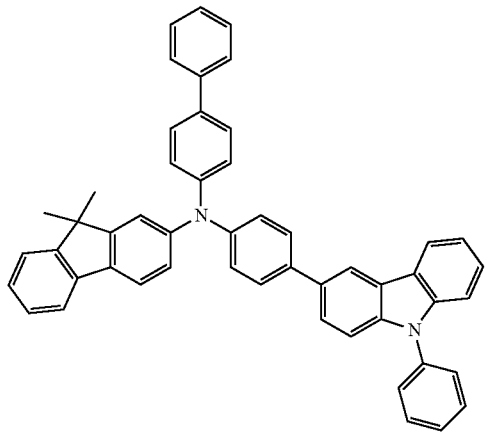

formula TA-7

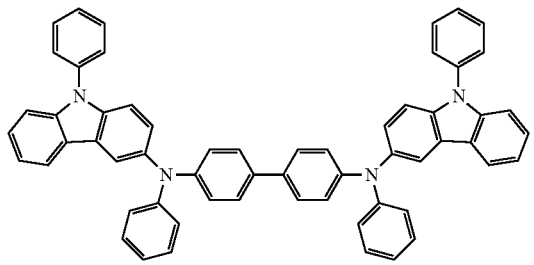

formula TA-8

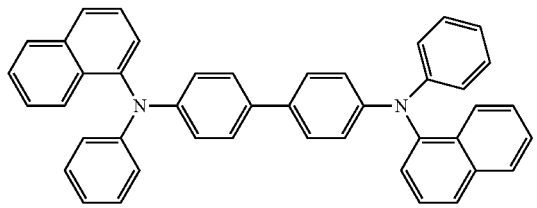

NPB = alpha-NPD formula TA-9

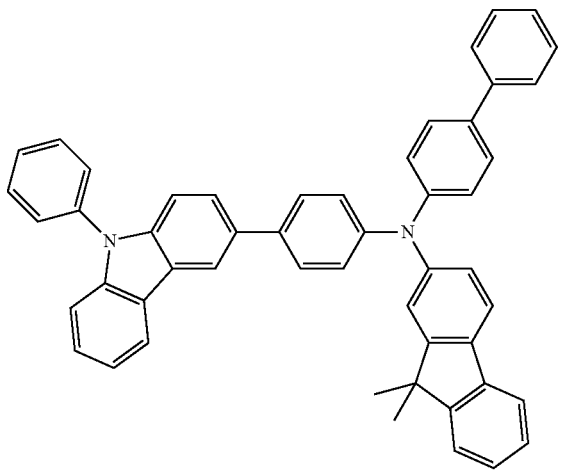

-continued formula TA-10

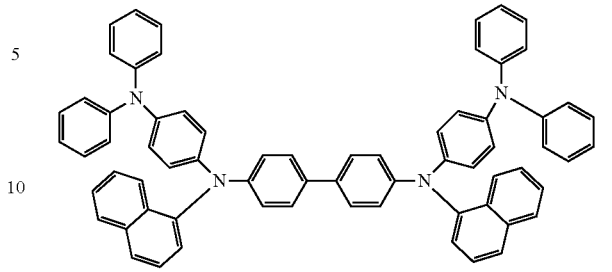

formula TA-11

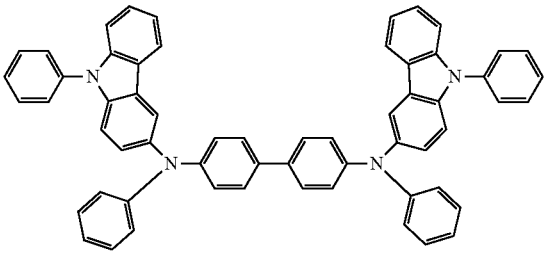

formula TA-12

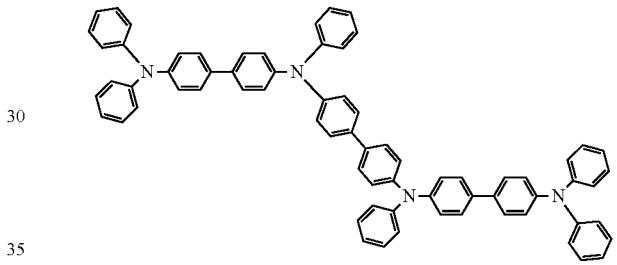

Further compounds which can be employed as hole-injection materials are described in EP 0891121 A1 and EP 1029909 A1, injection layers in general in US 2004/0174116 A1.

These arylamines and heterocycles which are generally employed as hole-injection and/or hole-transport materials preferably result in an HOMO in the polymer of greater than −5.8 eV (vs. vacuum level), particularly preferably greater than −5.5 eV.

Compounds which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O—S or N— containing heterocycles having a low LUMO (LUMO=lowest unoccupied molecular orbital).

Particularly suitable compounds for electron-transporting and electron-injecting layers are metal chelates of 8-hydroxyquinoline (for example LiQ, AlQ$_3$, GaQ$_3$, MgQ$_2$, ZnQ$_2$, InQ$_3$, ZrQ$_4$), BAlQ, Ga oxinoid complexes, 4-azaphenanthren-5-ol—Be complexes (U.S. Pat. No. 5,529,853 A, cf. formula ET-1), butadiene derivatives (U.S. Pat. No. 4,356,429), heterocyclic optical brighteners (U.S. Pat. No. 4,539,507), benzimidazole derivatives (US 2007/0273272 A1), such as, for example, TPBI (U.S. Pat. No. 5,766,779, cf. formula ET-2), 1,3,5-triazines, for example spirobifluorenyltriazine derivatives (for example in accordance with DE 102008064200), pyrenes, anthracenes, tetracenes, fluorenes, spiro-fluorenes, dendrimers, tetracenes (for example rubrene derivatives), 1,10-phenanthroline derivatives (JP 2003-115387, JP 2004-311184, JP-2001-267080, WO 02/043449), silacyclopentadiene derivatives (EP 1480280, EP 1478032, EP 1469533), borane derivatives, such as, for example, triarylborane derivatives containing Si (US 2007/ 0087219 A1, cf. formula ET-3), pyridine derivatives (JP 2004-200162), phenanthrolines, especially 1,10-phenanthroline derivatives, such as, for example, BCP and Bphen, also several phenanthrolines connected via biphenyl or other aromatic groups (US-2007-0252517 A1) or phenanthrolines connected to anthracene (US 2007-0122656 A1, cf. formulae ET-4 and ET-5).

formula ET-1

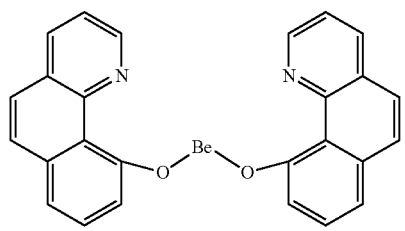

formula ET-2

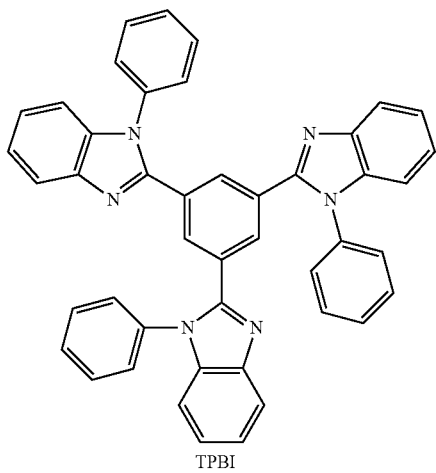

TPBI
2,2′,2″-(1,3,5-benzenetriyl)tris(1-phenyl-1H-benzimidazole)

formula ET-3

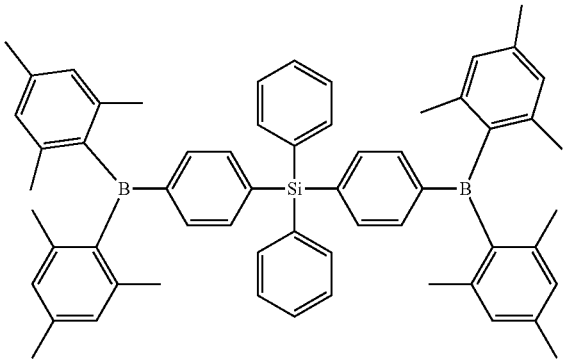

formula ET-4

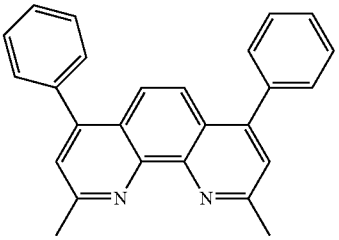

formula ET-5

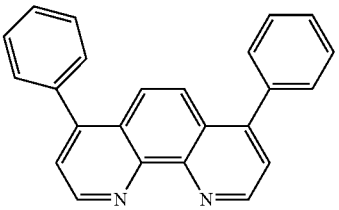

Likewise suitable are heterocyclic organic compounds, such as, for example, thiopyran dioxides, oxazoles, triazoles, imidazoles or oxadiazoles. Examples of the use of five-membered rings containing N, such as, for example, oxazoles, preferably 1,3,4-oxadiazoles, for example compounds of the formulae ET-6, ET-7, ET-8 and ET-9, which are disclose, inter alia, in US 2007/0273272 A1; thiazoles, oxadiazoles, thiadiazoles, triazoles, inter alia, see US 2008/ 0102311 A1 and Y. A. Levin, M. S. Skorobogatova, Khimiya Geterotsiklicheskikh Soedinenii 1967 (2), 339-341, preferably compounds of the formula ET-10, silacyclopentadiene derivatives. Preferred compounds are the following of the formulae (ET-6) to (ET-10):

formula ET-6

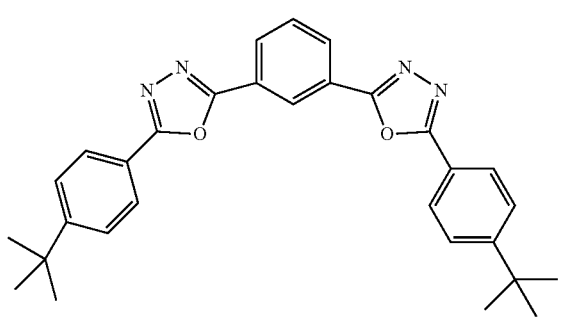

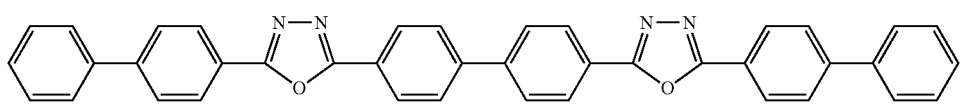

formula ET-7

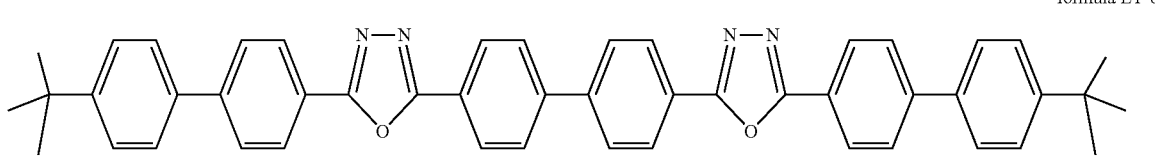

formula ET-8

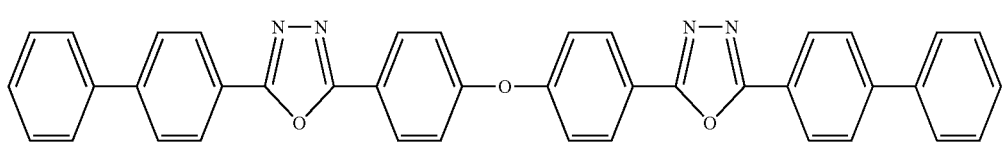

formula ET-9

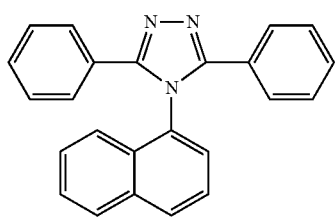

formula ET-10

It is also possible to employ organic compounds, such as derivatives of fluorenone, fluorenylidenemethane, perylenetetracarbonic acid, anthra-quinonedimethane, diphenoquinone, anthrone and anthraquinone-diethylenediamine.

Preference is given to 2,9,10-substituted anthracenes (with 1- or 2-naphthyl and 4- or 3-biphenyl) or molecules which contain two anthracene units (US2008/0193796 A1, cf. formula ET-11). Also very advantageous is the connection of 9,10-substituted anthracene units to benzimidazole derivatives (US 2006 147747 A and EP 1551206 A1, cf. formulae ET-12 and ET-13).

formula ET-11

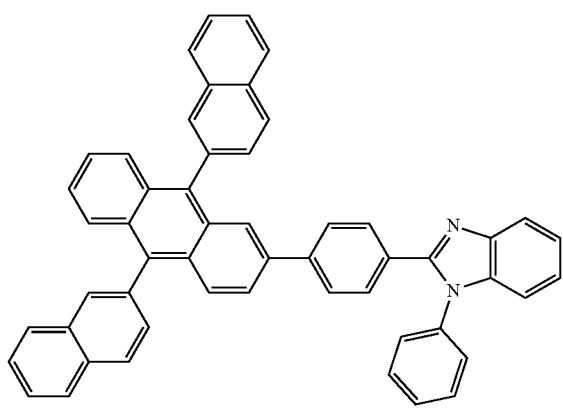

formula ET-12

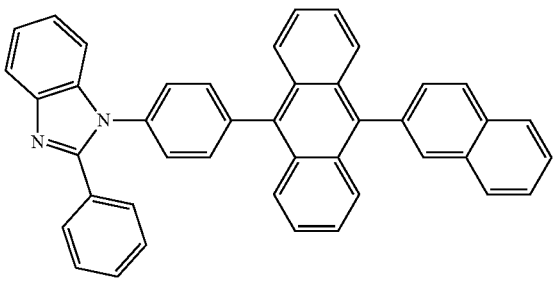

formula ET-13

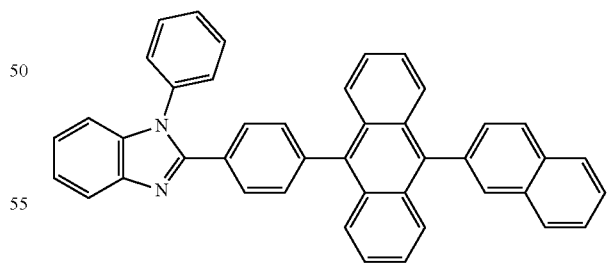

The compounds which are able to generate electron-injection and/or electron-transport properties preferably result in an LUMO of less than −2.5 eV (vs. vacuum level), particularly preferably less than −2.7 eV.

n-Dopants herein are taken to mean reducing agents, i.e. electron donors. Preferred examples of n-dopants are W(hpp)$_4$ and other electron-rich metal complexes in accordance with WO 2005/086251 A2, P=N compounds (for example WO 2012/175535 A1, WO 2012/175219 A1), naphthylenecarbo-diimides (for example WO 2012/168358 A1), fluorenes (for example WO 2012/031735 A1), free radicals and diradicals (for example EP 1837926 A1, WO 2007/107306 A1), pyridines (for example EP 2452946 A1, EP 2463927 A1), N-heterocyclic compounds (for example WO 2009/000237 A1) and acridines as well as phenazines (for example US 2007/145355 A1).

The present formulations may comprise emitters. The term emitter denotes a material which, after excitation, which can take place by transfer of any type of energy, allows a radiative transition into a ground state with emission of light. In general, two classes of emitter are known, namely fluorescent and phosphorescent emitters. The term fluorescent emitter denotes materials or compounds in which a radiative transition from an excited singlet state into the ground state takes place. The term phosphorescent emitter preferably denotes luminescent materials or compounds which contain transition metals.

Emitters are frequently also called dopants if the dopants cause the properties described above in a system. A dopant in a system comprising a matrix material and a dopant is taken to mean the component whose proportion in the mixture is the smaller. Correspondingly, a matrix material in a system comprising a matrix material and a dopant is taken to mean the component whose proportion in the mixture is the greater. Accordingly, the term phosphorescent emitter can also be taken to mean, for example, phosphorescent dopants.

Compounds which are able to emit light include, inter alia, fluorescent emitters and phosphorescent emitters. These include, inter alia, compounds containing stilbene, stilbenamine, styrylamine, coumarine, rubrene, rhodamine, thiazole, thiadiazole, cyanine, thiophene, paraphenylene, perylene, phtalocyanine, porphyrin, ketone, quinoline, imine, anthracene and/or pyrene structures. Particular preference is given to compounds which are able to emit light from the triplet state with high efficiency, even at room temperature, i.e. exhibit electrophosphorescence instead of electro-fluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding compounds which contain elements from group 8 to 10 (Ru, Os, Rh, Ir, Pd, Pt). Suitable functional compounds here are, for example, various complexes, as described, for example, in WO 02/068435 A1, WO 02/081488 A1, EP 1239526 A2 and WO 2004/026886 A2.

Preferred compounds which can serve as fluorescent emitters are described by way of example below. Preferred fluorescent emitters are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stil-benes, which may also be further substituted. Corresponding phosphines and ethers are defined analogously to the amines. An arylamine or an aromatic amine in the sense of the present invention is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracenamines, aromatic anthracene-diamines, aromatic pyrenamines, aromatic pyrenediamines, aromatic chrysenamines or aromatic chrysenediamines. An aromatic anthracen-amine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Further preferred fluorescent emitters are selected from indenofluorenamines or indenofluorenediamines, which are described, inter alia, in WO 2006/122630; benzoindenofluorenamines or benzoindenofluorenedi-amines, which are described, inter alia, in WO 2008/006449; and dibenzoindenofluorenamines or dibenzoindenofluorenediamines, which are described, inter alia, in WO 2007/140847.

Examples of compounds from the class of the styrylamines which can be employed as fluorescent emitters are substituted or unsubstituted tristilben-amines or the dopants described in WO 2006/000388, WO 2006/058737, WO 2006/000389, WO 2007/065549 and WO 2007/115610. Distyryl-benzene and distyrylbiphenyl derivatives are described in U.S. Pat. No. 5,121,029. Further styrylamines can be found in US 2007/0122656 A1.

Particularly preferred styrylamine compounds are the compounds of the formula EM-1 described in U.S. Pat. No. 7,250,532 B2 and the compounds of the formula EM-2 described in DE 10 2005 058557 A1:

formula EM-1

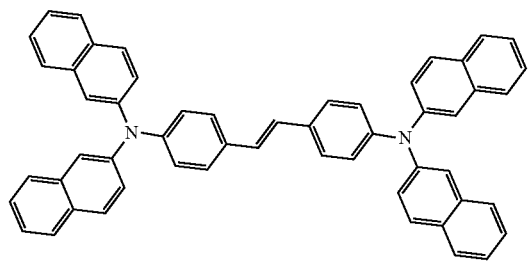

-continued
formula EM-2
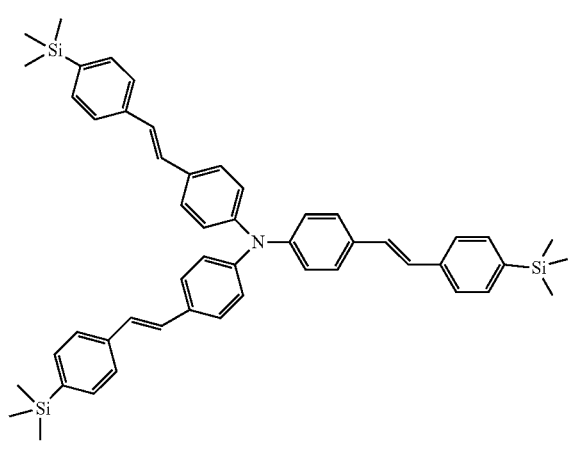
Particularly preferred triarylamine compounds are compounds of the formulae EM-3 to EM-15 disclosed in CN 1583691 A, JP 08/053397 A and U.S. Pat. No. 6,251,531 B1, EP 1957606 A1, US 2008/0113101 A1, US 2006/210830 A, WO 2008/006449 and DE 102008035413 and derivatives thereof:
formula EM-3
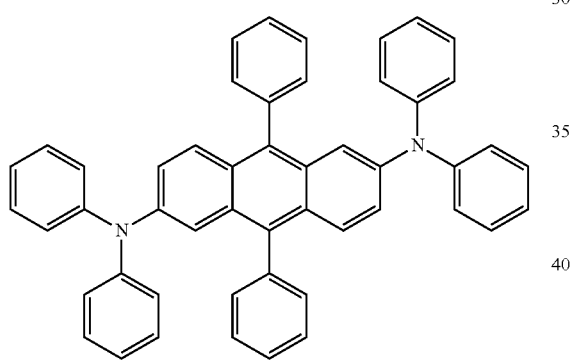
formula EM-4
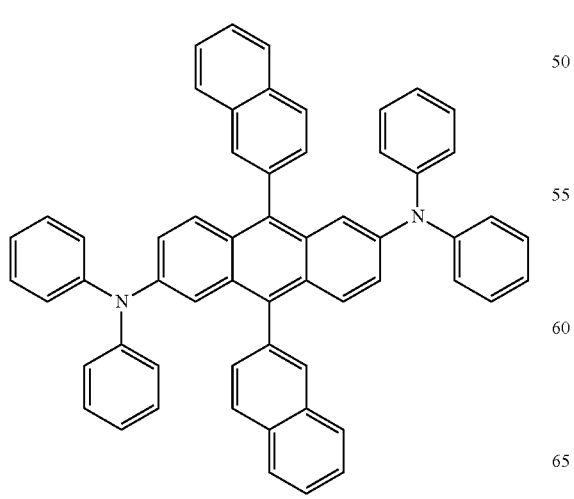
formula EM-5
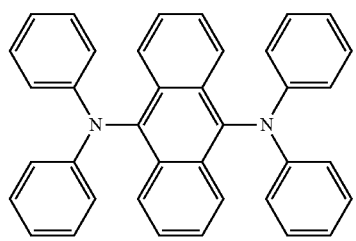
formula EM-6
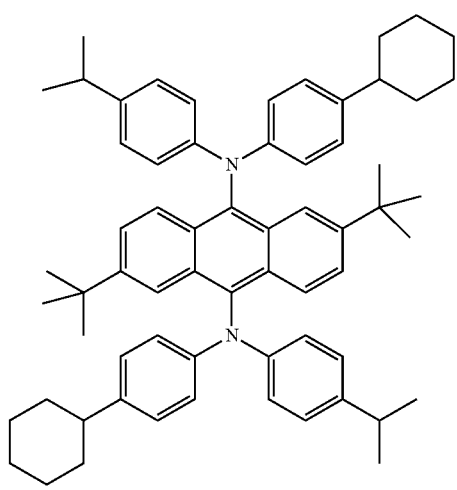
formula EM-7
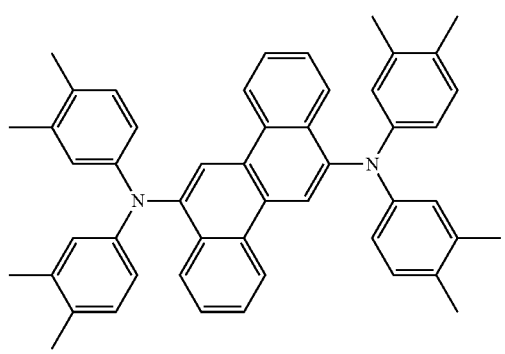
formula EM-8
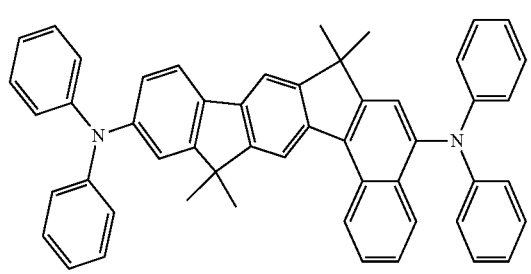

-continued formula EM-9

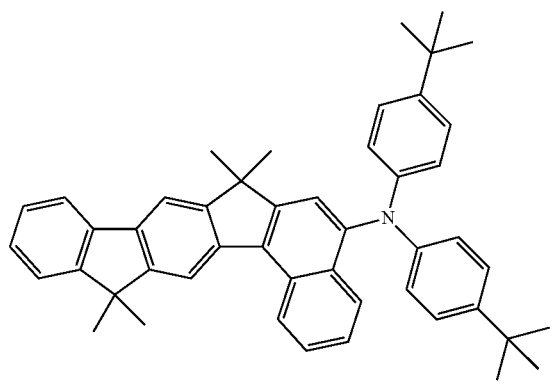

formula EM-10

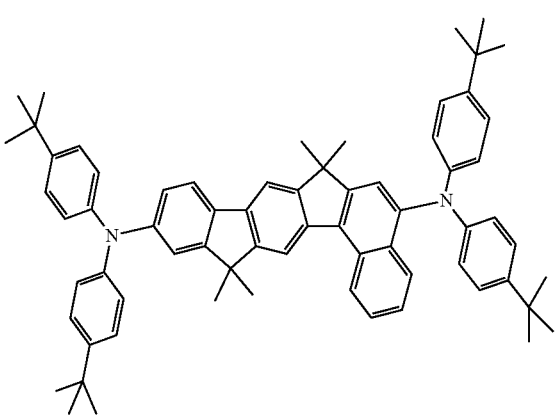

formula EM-11

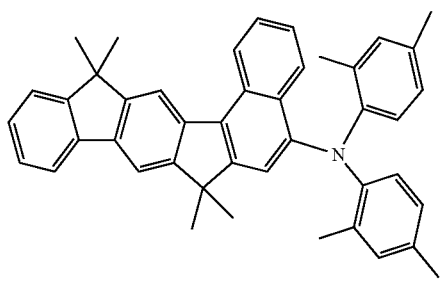

formula EM-12

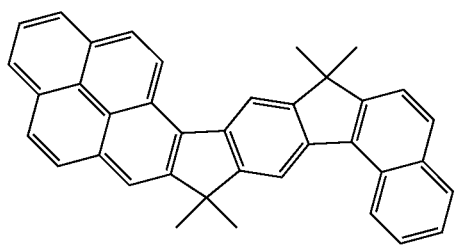

-continued formula EM-13

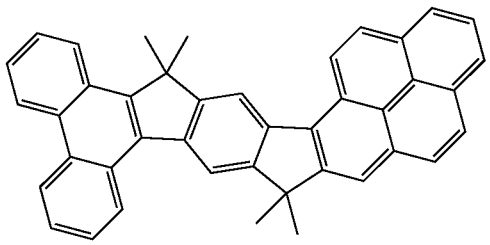

formula EM-14

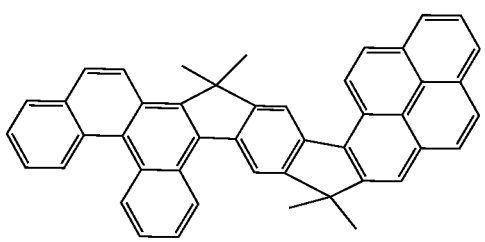

formula EM-15

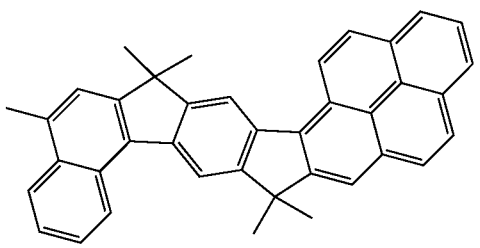

Further preferred compounds which can be employed as fluorescent emitters are selected from derivatives of naphthalene, anthracene, tetracene, benzanthracene, benzophenanthrene (DE 10 2009 005746), fluorene, fluoranthene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. Nos. 4,769,292, 6,020,078, US 2007/0252517 A1), pyran, oxazole, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)-benzene is also a preferred dopant.

Preference is likewise given to derivatives of rubrene, coumarine, rhodamine, quinacridone, such as, for example, DMQA (=N,N'-dimethylquinacri-done), dicyanomethylenepyran, such as, for example, DCM (=4-(dicyano-ethylene)-6-(4-dimethylaminostyryl-2-methyl)-4H-pyran), thiopyran, polymethine, pyrylium and thiapyrylium salts, periflanthene and indenoperylene. Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-bis(9-ethyl-3-carbazovinylene)-1,1'-biphenyl, fluorene, fluoranthene, arylpyrenes (US 2006/0222886 A1), arylenevinylenes (U.S. Pat. Nos. 5,121,029, 5,130,603), bis-(azinyl)imine-boron compounds (US 2007/0092753 A1), bis(azinyl)methene compounds and carbostyryl compounds.

Further preferred blue fluorescent emitters are described in C. H. Chen et al.: "Recent developments in organic electroluminescent materials" Macro-mol. Symp. 125, (1997) 1-48 and "Recent progress of molecular organic electroluminescent materials and devices" Mat. Sci. and Eng. R, 39 (2002), 143-222.

Further preferred blue-fluorescent emitters are the hydrocarbons disclosed in WO 2010/012328 A1, WO 2014/111269 A2 and PCT/EP2017/066712.

Preferred compounds which can serve as phosphorescent emitters are described below by way of example.

Examples of phosphorescent emitters are revealed by WO 00/70655, WO 01/41512, WO 02/02714, WO 02/15645, EP 1191613, EP 1191612, EP 1191614 and WO 2005/033244. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

Phosphorescent metal complexes preferably contain Ir, Ru, Pd, Pt, Os or Re.

Preferred ligands are 2-phenylpyridine derivatives, 7,8-benzoquinoline derivatives, 2-(2-thienyl)pyridine derivatives, 2-(1-naphthyl)pyridine derivatives, 1-phenylisoquinoline derivatives, 3-phenylisoquinoline derivatives or 2-phenylquinoline derivatives. All these compounds may be substituted, for example by fluoro, cyano and/or trifluoromethyl substituents for blue. Aux-iliary ligands are preferably acetylacetonate or picolinic acid.

In particular, complexes of Pt or Pd with tetradentate ligands of the formula EM-16 are suitable formula EM-16

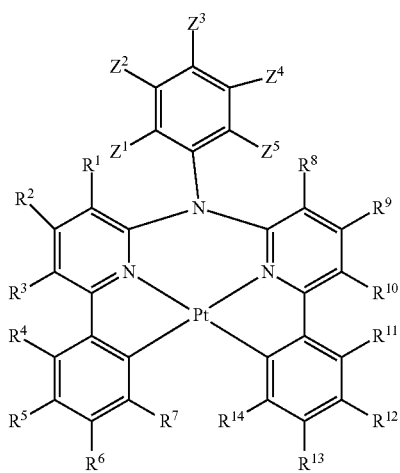

The compounds of the formula EM-16 are described in greater detail in US 2007/0087219 A1, where, for an explanation of the substituents and indices in the above formula, reference is made to this specification for disclosure purposes. Furthermore, Pt-porphyrin complexes having an enlarged ring system (US 2009/0061681 A1) and Ir complexes, for example 2,3,7,8,12,13,17,18-octaethyl-21H,23H-porphyrin-Pt(II), tetraphenyl-Pt(II) tetrabenzoporphyrin (US 2009/0061681 A1), cis-bis(2-phenylpyridinato-N,$C^{2'}$)Pt(II), cis-bis(2-(2'-thienyl)pyridinato-N,$C^{3'}$)Pt(II), cis-bis(2-(2'-thienyl)-quinolinato-N,$C^{5'}$)Pt(II), (2-(4,6-difluorophenyl)pyridinato-N,$C^{2'}$)Pt(II) (acetylacetonate), or tris(2-phenylpyridinato-N,$C^{2'}$)Ir(III) (=Ir(ppy)$_3$, green), bis(2-phenylpyridinato-N,$C^{2'}$)Ir(III) (acetylacetonate) (=Ir(ppy)$_2$acetylacetonate, green, US 2001/0053462 A1, Baldo, Thompson et al. Nature 403, (2000), 750-753), bis(1-phenylisoquinolinato-N,$C^{2'}$)(2-phenylpyridinato-N,$C^{2'}$)-iridium(III), bis(2-phenylpyridinato-N,$C^{2'}$)(1-phenylisoquinolinato-N,$C^{2'}$)-iridium(III), bis(2-(2'-benzothienyl)pyridinato-N,$C^{3'}$)iridium(III) (acetylacetonate), bis(2-(4',6'-difluorophenyl)pyridinato-N,$C^{2'}$)iridium(III) (piccolinate) (FIrpic, blue), bis(2-(4',6'-difluorophenyl)pyridinato-N,$C^{2'}$)Ir(III) (tetrakis(1-pyrazolyl)borate), tris(2-(biphenyl-3-yl)-4-tert-butylpyridine)-iridium(III), (ppz)$_2$Ir(5phdpym) (US 2009/0061681 A1), (45ooppz)$_2$-Ir(5phdpym) (US 2009/0061681 A1), derivatives of 2-phenylpyridine-Ir complexes, such as, for example, PQIr (=iridium(III) bis(2-phenylquinolyl-N,$C^{2'}$)acetylacetonate), tris(2-phenylisoquinolinato-N,C)Ir(III) (red), bis(2-(2'-benzo[4,5-a]thienyl)pyridinato-N,$C^3$)Ir (acetylacetonate) ([Btp$_2$Ir(acac)], red, Adachi et al. Appl. Phys. Lett. 78 (2001), 1622-1624).

Likewise suitable are complexes of trivalent lanthanides, such as, for example, Tb$^{3+}$ and Eu$^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl-diimine complexes (Wrighton, JACS 96, 1974, 998, inter alia), Os(II) complexes with cyano ligands and bipyridyl or phenanthroline ligands (Ma et al., Synth. Metals 94, 1998, 245).

Further phosphorescent emitters having tridentate ligands are described in U.S. Pat. No. 6,824,895 and U.S. Ser. No. 10/729,238. Red-emitting phosphorescent complexes are found in U.S. Pat. Nos. 6,835,469 and 6,830,828.

Particularly preferred compounds which are used as phosphorescent dopants are, inter alia, the compounds of the formula EM-17 described, inter alia, in US 2001/0053462 A1 and lnorg. Chem. 2001, 40(7), 1704-1711, JAGS 2001, 123(18), 4304-4312, and derivatives thereof.

formula EM-17

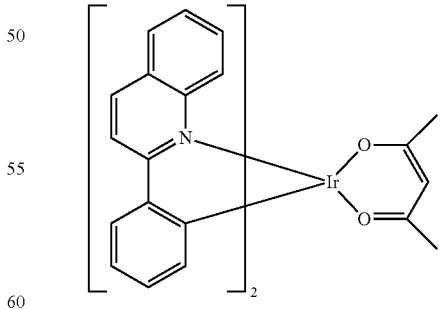

Derivatives are described in U.S. Pat. No. 7,378,162 B2, U.S. Pat. No. 6,835,469 B2 and JP 2003/253145 A.

Furthermore, the compounds of the formulae EM-18 to EM-21 described in U.S. Pat. No. 7,238,437 B2, US 2009/008607 A1 and EP 1348711, and derivatives thereof, can be employed as emitters.

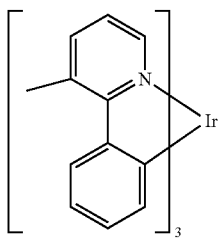

formula EM-18

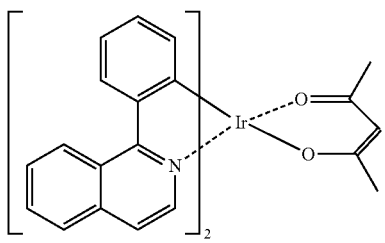

formula EM-19

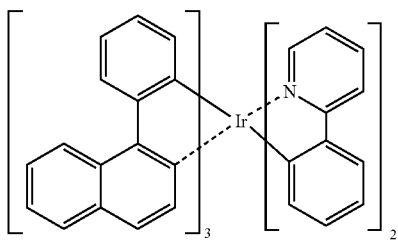

formula EM-20

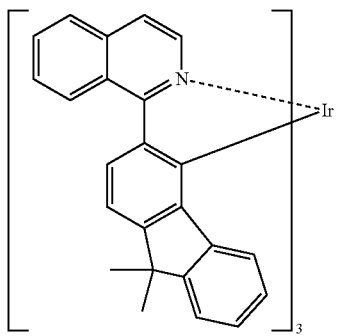

formula EM-21

Quantum dots can likewise be employed as emitters, these materials being disclosed in detail in WO 2011/076314 A1.

Compounds which are employed as host materials, in particular together with emitting compounds, include materials from various classes of substance.

Host materials gereally have larger band gaps between HOMO and LUMO than the emitter materials employed. In addition, preferred host materials exhibit properties of either a hole- or electron-transport material. Furthermore, host materials can have both electron- and hole-transport properties.

Host materials are in some cases also called matrix material, in particular if the host material is employed in combination with a phosphorescent emitter in an OLED.

Preferred host materials or co-host materials, which are employed, in particular, together with fluorescent dopants, are selected from the classes of the oligoarylenes (for example 2,2',7,7'-tetraphenylspirobifluorene in accordance with EP 676461 or dinaphthylanthracene), in particular the oligoarylenes containing condensed aromatic groups, such as, for example, anthracene, benzanthracene, benzophenanthrene (DE 10 2009 005746, WO 2009/069566), phenanthrene, tetracene, coronene, chrysene, fluorene, spirofluorene, perylene, phthaloperylene, naphthaloperylene, decacyclene, rubrene, the oligoarylenevinylenes (for example DPVBi=4,4'-bis(2,2-diphenylethenyl)-1,1'-biphenyl or spiro-DPVBi in accordance with EP 676461), the polypodal metal complexes (for example in accordance with WO 04/081017), in particular metal complexes of 8-hydroxyquinoline, for example AlQ$_3$ (=aluminium(III) tris(8-hydroxyquinoline)) or bis(2-methyl-8-quinolinolato)-4-(phenylphenolinolato)aluminium, also with imidazole chelate (US 2007/0092753 A1) and the quinoline-metal complexes, amino-quinoline-metal complexes, benzoquinoline-metal complexes, the hole-transporting compounds (for example in accordance with WO 2004/058911), the electron-transporting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239).

Particularly preferred compounds which can serve as host materials or co-host materials are selected from the classes of the oligoarylenes, comprising anthracene, benzanthracene and/or pyrene, or atropisomers of these compounds. An oligoarylene in the sense of the present invention is intended to be taken to mean a compound in which at least three aryl or arylene groups are bonded to one another.

Preferred host materials are selected, in particular, from compounds of the formula (H-1), $$Ar^4-(Ar^5)_p-Ar^6 \quad (H\text{-}1)$$

where $Ar^4$, $Ar^5$, $Ar^6$ are on each occurrence, identically or differently, an aryl or heteroaryl group having 5 to 30 aromatic ring atoms, which may optionally be substituted, and p represents an integer in the range from 1 to 5; the sum of the π electrons in $Ar^4$, $Ar^5$ and $Ar^6$ is at least 30 if p=1 and at least 36 if p=2 and at least 42 if p=3.

In the compounds of the formula (H-1), the group $Ar^5$ particularly preferably stands for anthracene, and the groups $Ar^4$ and $Ar^6$ are bonded in the 9- and 10-position, where these groups may optionally be substituted. Very par-titularly preferably, at least one of the groups $Ar^4$ and/or $Ar^6$ is a condensed aryl group selected from 1- or 2-naphthyl, 2-, 3- or 9-phenanthrenyl or 2-, 3-, 4-, 5-, 6- or 7-benzanthracenyl. Anthracene-based compounds are described in US 2007/0092753 A1 and US 2007/0252517 A1, for example 2-(4-methylphenyl)-9,10-di-(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds containing two anthracene units (US 2008/0193796 A1), for example 10,10'-bis[1,1',4',1"]terphenyl-2-yl-9,9'-bisanthracenyl.

Further preferred compounds are derivatives of arylamine, styrylamine, fluorescein, diphenylbutadiene, tetraphenylbutadiene, cyclopentadiene, tetraphenylcyclopentadiene, pentaphenylcyclopentadiene, coumarine, oxadiazole, bisbenzoxazoline, oxazole, pyridine, pyrazine, imine, benzothiazole, benzoxazole, benzimidazole (US 2007/0092753 A1), for example 2,2',2"-(1,3,5-phenylene)tris[1-phenyl-1H-benzimidazole], aldazine, stilbene, styrylarylene derivatives, for example 9,10-bis[4-(2,2-diphenyl-ethenyl)phenyl]anthracene, and distyrylarylene derivatives (U.S. Pat. No.

5,121,029), diphenylethylene, vinylanthracene, diaminocarbazole, pyran, thiopyran, diketopyrrolopyrrole, polymethine, cinnamic acid esters and fluorescent dyes.

Particular preference is given to derivatives of arylamine and styrylamine, for example TNB (=4,4'-bis[N-(1-naphthyl)-N-(2-naphthyl)amino]biphenyl). Metal-oxinoid complexes, such as LiQ or AlQ$_3$, can be used as co-hosts.

Preferred compounds with oligoarylene as matrix are disclosed in US 2003/0027016 A1, U.S. Pat. No. 7,326,371 B2, US 2006/043858 A, WO 2007/114358, WO 2008/145239, JP 3148176 B2, EP 1009044, US 2004/018383, WO 2005/061656 A1, EP 068101961, WO 2004/013073A1, U.S. Pat. No. 5,077,142, WO 2007/065678 and DE 102009005746, where particularly preferred compounds are described by the formulae H-2 to H-8.

formula H-2

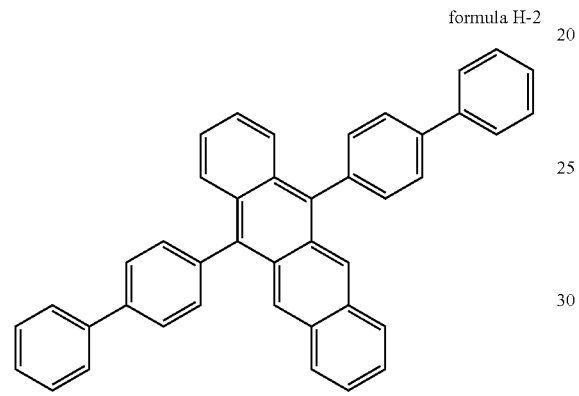

formula H-3

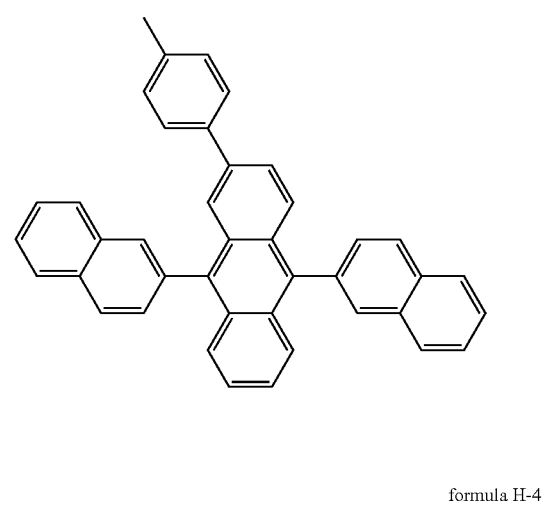

formula H-4

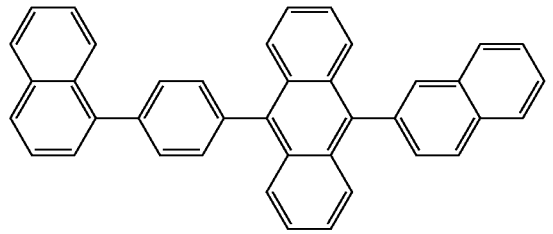

formula H-5

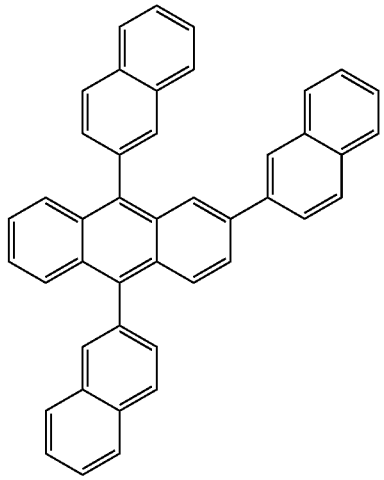

formula H-6

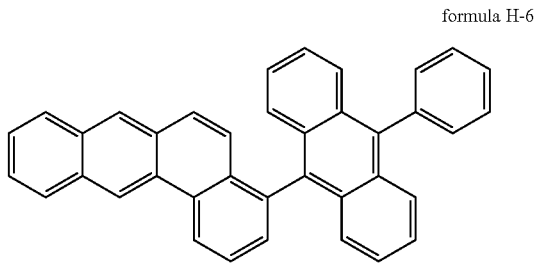

formula H-7

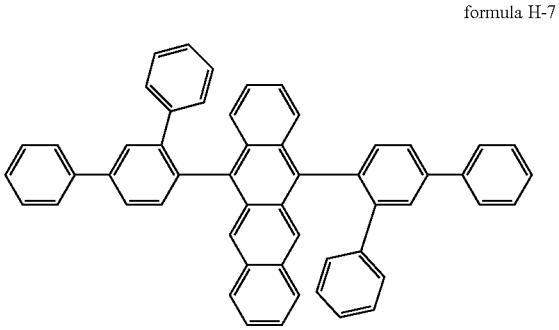

formula H-8

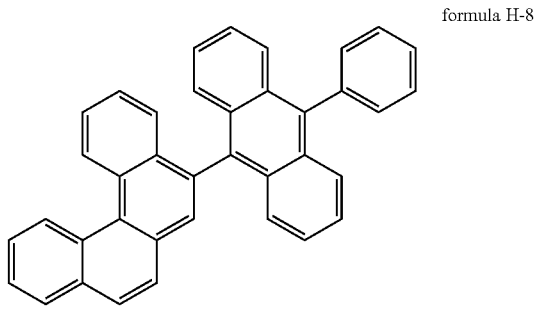

Furthermore, compounds which can be employed as host or matrix include materials which are employed together with phosphorescent emitters.

These compounds, which can also be employed as structural elements in polymers, include CBP (N,N-biscarbazolylbiphenyl), carbazole derivatives (for example in accordance with WO 2005/039246, US 2005/0069729, JP 2004/288381, EP 1205527 or WO 2008/086851), azacarbazoles (for example in accordance with EP 1617710, EP 1617711, EP 1731584 or JP 2005/347160), ketones (for example in accordance with WO 2004/093207 or in accordance with DE 102008033943), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (for example in accordance with DE 102008017591), azaboroles or boronic esters (for example in accordance with WO 2006/117052), triazine derivatives (for example in accordance with DE 102008036982), indolocarbazole derivatives (for example in accordance with WO 2007/063754 or WO 2008/056746), indenocarbazole derivatives (for example in accordance with DE 102009023155 and DE 102009031021), diazaphosphole derivatives (for example in accordance with DE 102009022858), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, such as, for example, AlQ$_3$, which may also contain triarylaminophenol ligands (US 2007/0134514 A1), metal complex/poly-silane compounds, and thiophene, benzothiophene and dibenzothiophene derivatives.

Examples of preferred carbazole derivatives are mCP (=1,3-N,N-di-carbazolylbenzene (=9,9'-(1,3-phenylene)bis-9H-carbazole)) (formula H-9), CDBP (=9,9'-(2,2'-dimethyl[1,1'-biphenyl]-4,4'-diyl)bis-9H-carbazole), 1,3-bis(N,N'-dicarbazolyl)benzene (=1,3-bis(carbazol-9-yl)benzene), PVK (polyvinylcarbazole), 3,5-di(9H-carbazol-9-yl)biphenyl and CMTTP (formula H-10). Particularly referred compounds are disclosed in US 2007/0128467 A1 and US 2005/0249976 A1 (formulae H-11 and H-13).

formula H-9 formula H-10

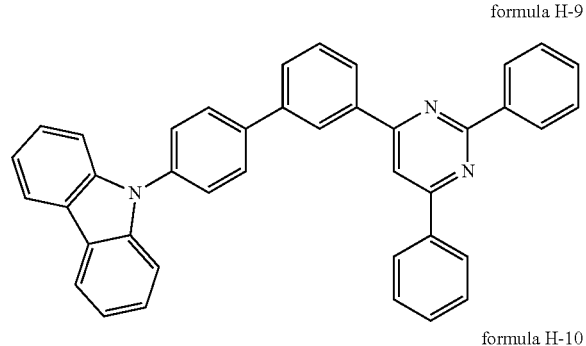

CMTTP formula H-11

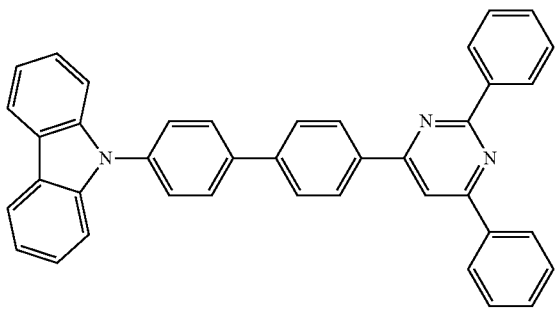

formula H-12

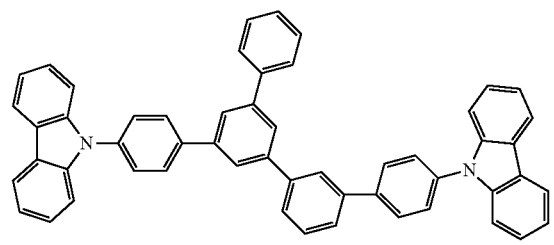

formula H-13

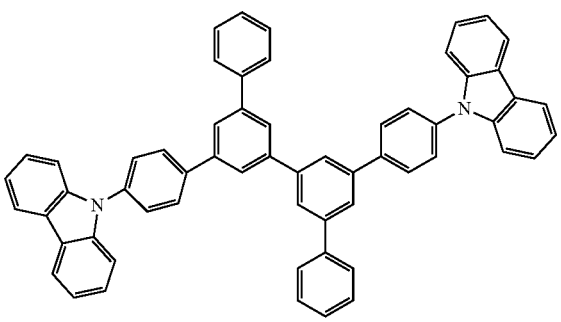

Preferred tetraaryl-Si compounds are disclosed, for example, in US 2004/0209115, US 2004/0209116, US 2007/0087219 A1 and in H. Gilman, E. A. Zuech, Chemistry & Industry (London, United Kingdom), 1960, 120.

Particularly preferred tetraaryl-Si compounds are described by the formulae H-14 to H-20.

formula H-14

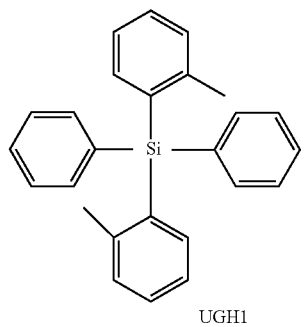

UGH1 formula H-15

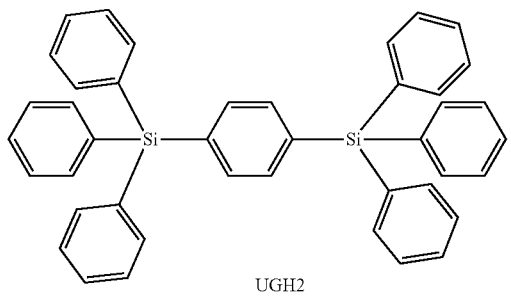

UGH2 formula H-16

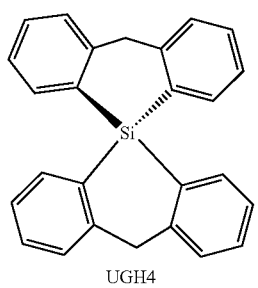

UGH4 formula H-17

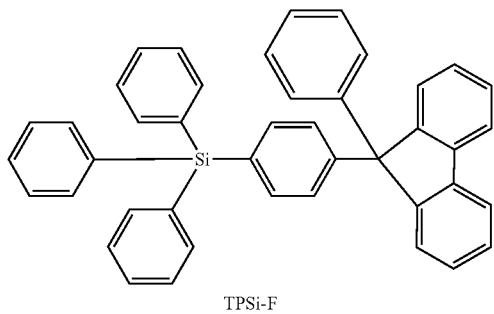

TPSi-F
Triphenyl-[4-(9-phenyl-9H-fluoren-9-yl)phenyl]silane formula H-18

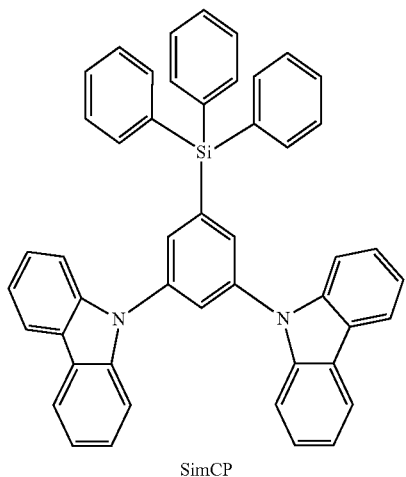

SimCP formula H-19

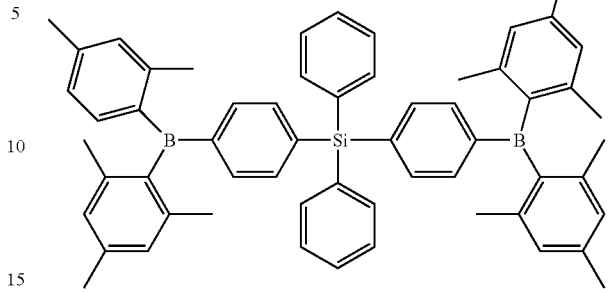

formula H-20

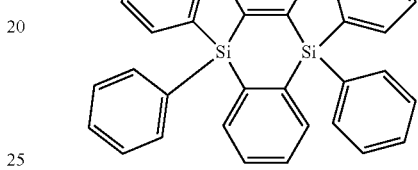

formula H-21

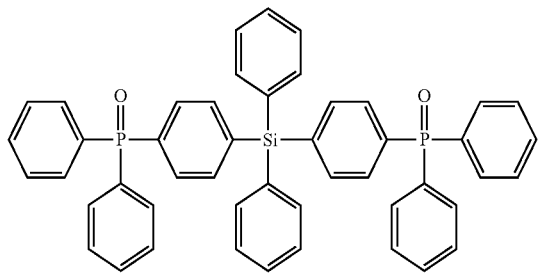

Particularly preferred compounds from group 4 for the preparation of the matrix for phosphorescent dopants are disclosed, inter alia, in DE 102009022858, DE 102009023155, EP 652273 B1, WO 2007/063754 and WO 2008/056746, where particularly preferred compounds are described by the formulae H-21 to H-24.

formula H-22

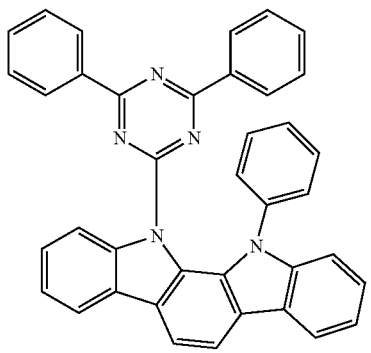

formula H-23

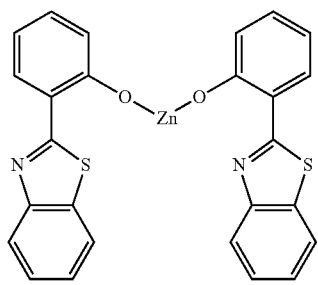

formula H-24

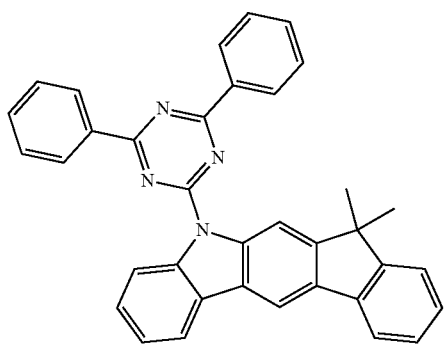

formula H-25

With respect to the functional compounds which can be employed in accordance with the invention and which can serve as host material, especial preference is given to substances which contain at least one nitrogen atom. These preferably include aromatic amines, triazine derivatives and carbazole derivatives. Thus, carbazole derivatives in particular exhibit surprisingly high efficiency. Triazine derivatives result in unexpectedly long lifetimes of the electronic devices.

It may also be preferred to employ a plurality of different matrix materials as a mixture, in particular at least one electron-transporting matrix material and at least one hole-transporting matrix material. Preference is likewise given to the use of a mixture of a charge-transporting matrix material and an electrically inert matrix material which is not in involved in the charge transport to a significant extent, if at all, as described, for example, in WO 2010/108579.

It is furthermore possible to employ compounds which improve the transition from the singlet state to the triplet state and which, employed in support of the functional compounds having emitter properties, improve the phosphorescence properties of these compounds. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Furthermore, the formulations may comprise a wide-band-gap material as functional material. Wide-band-gap material is taken to mean a material in the sense of the disclosure content of U.S. Pat. No. 7,294,849. These systems exhibit particularly advantageous performance data in electroluminescent devices.

The compound employed as wide-band-gap material can preferably have a band gap of 2.5 eV or more, preferably 3.0 eV or more, particularly preferably 3.5 eV or more. The band gap can be calculated, inter alia, by means of the energy levels of the highest occupied molecular orbital (HOMO) and the lowest unoccupied molecular orbital (LUMO).

Furthermore, the formulations may comprise a hole-blocking material (HBM) as functional material. A hole-blocking material denotes a material which prevents or minimises the transmission of holes (positive charges) in a multilayer system, in particular if this material is arranged in the form of a layer adjacent to an emission layer or a hole-transporting layer. In general, a hole-blocking material has a lower HOMO level than the hole-transport material in the adjacent layer. Hole-blocking layers are frequently arranged between the light-emitting layer and the electron-transport layer in OLEDs.

It is basically possible to employ any known hole-blocking material. In addition to other hole-blocking materials described elsewhere in the present application, advantageous hole-blocking materials are metal complexes (US 2003/0068528), such as, for example, bis(2-methyl-8-quinolinolato)(4-phenylphenolato)aluminium(III) (BAlQ). Fac-tris(1-phenylpyrazolato-N,C2)- iridium(III) (Ir(ppz)$_3$) is likewise employed for this purpose (US 2003/0175553 A1). Phenanthroline derivatives, such as, for example, BCP, or phthalimides, such as, for example, TMPP, can likewise be employed.

Furthermore, advantageous hole-blocking materials are described in WO 00/70655 A2, WO 01/41512 and WO 01/93642 A1.

Furthermore, the formulations may comprise an electron-blocking material (EBM) as functional material. An electron-blocking material denotes a material which prevents or minimises the transmission of electrons in a multilayer system, in particular if this material is arranged in the form of a layer adjacent to an emission layer or an electron-transporting layer. In general, an electron-blocking material has a higher LUMO level than the electron-transport material in the adjacent layer.

It is basically possible to employ any known electron-blocking material. In addition to other electron-blocking materials described elsewhere in the present application, advantageous electron-blocking materials are transition-metal complexes, such as, for example, Ir(ppz)$_3$ (US 2003/0175553).

The electron-blocking material can preferably be selected from amines, triarylamines and derivatives thereof.

Furthermore, the functional compounds which can be employed as organic functional materials in the formulations preferably have, if they are low-molecular-weight compounds, a molecular weight of ≤3,000 g/mol, particularly preferably ≤2,000 g/mol and especially preferably ≤1,800 g/mol.

Of particular interest are furthermore functional compounds which are distinguished by a high glass-transition temperature. In this connection, particularly preferred functional compounds which can be employed as organic functional material in the formulations are those which have a glass-transition temperature of ≥70° C., preferably ≥100° C., particularly preferably ≥125° C. and especially preferably 150° C., determined in accordance with DIN 51005.

The formulations may also comprise polymers as organic functional materials. The compounds described above as organic functional materials, which frequently have a relatively low molecular weight, can also be mixed with a polymer. It is likewise possible to incorporate these compounds covalently into a polymer. This is possible, in particular, with compounds which are substituted by reactive leaving groups, such as bromine, iodine, chlorine, boronic acid or boronic acid ester, or by reactive, polymerisable groups, such as olefins or oxetanes. These can be used as monomers for the production of corresponding oligomers, dendrimers or polymers. The oligo-merisation or polymerisation here preferably takes place via the halogen functionality or the boronic acid functionality or via the polymerisable group. It is furthermore possible to crosslink the polymers via groups of this type. The compounds and polymers according to the invention can be employed as crosslinked or uncrosslinked layer.

Polymers which can be employed as organic functional materials frequently contain units or structural elements which have been described in the con-text of the compounds described above, inter alia those as disclosed and extensively listed in WO 02/077060 A1, in WO 2005/014689 A2 and in WO 2011/076314 A1. These are incorporated into the present application by way of reference. The functional materials can originate, for example, from the following classes:

Group 1: structural elements which are able to generate hole-injection and/or hole-transport properties;
Group 2: structural elements which are able to generate electron-injection and/or electron-transport properties;
Group 3: structural elements which combine the properties described in relation to groups 1 and 2;
Group 4: structural elements which have light-emitting properties, in particular phosphorescent groups;
Group 5: structural elements which improve the transition from the so-called singlet state to the triplet state;
Group 6: structural elements which influence the morphology or also the emission colour of the resultant polymers;
Group 7: structural elements which are typically used as backbone.

The structural elements here may also have various functions, so that a clear assignment need not be advantageous. For example, a structural element of group 1 may likewise serve as backbone.

The polymer having hole-transport or hole-injection properties employed as organic functional material, containing structural elements from group 1, may preferably contain units which correspond to the hole-transport or hole-injection materials described above.

Further preferred structural elements of group 1 are, for example, triarylamine, benzidine, tetraaryl-para-phenylene-diamine, carbazole, azulene, thiophene, pyrrole and furan derivatives and further O—, S— or N— containing heterocycles having a high HOMO. These arylamines and heterocycles preferably have an HOMO of above −5.8 eV (against vacuum level), particularly preferably above −5.5 eV.

Preference is given, inter alia, to polymers having hole-transport or hole-injection properties, containing at least one of the following recurring units of the formula HTP-1:

HTP-1 in which the symbols have the following meaning:
$Ar^1$ is, in each case identically or differently for different recurring units, a single bond or a monocyclic or polycyclic aryl group, which may optionally be substituted;
$Ar^2$ is, in each case identically or differently for different recurring units, a monocyclic or polycyclic aryl group, which may optionally be substituted;
$Ar^3$ is, in each case identically or differently for different recurring units, a monocyclic or polycyclic aryl group, which may optionally be substituted;
m is 1, 2 or 3.

Particular preference is given to recurring units of the formula HTP-1 which are selected from the group consisting of units of the formulae HTP-1A to HTP-1C:

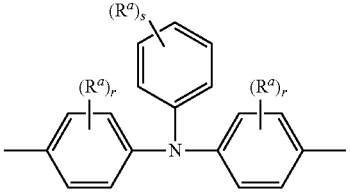

HTP-1A

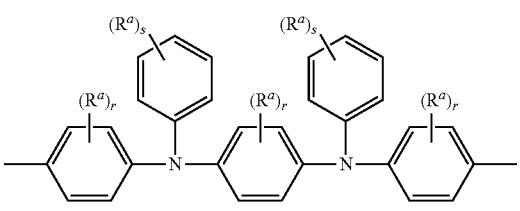

HTP-1B

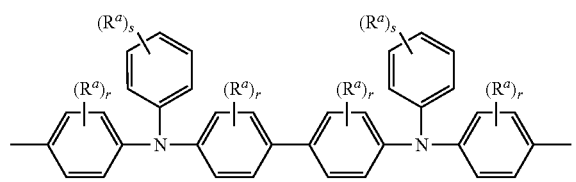

HTP-1C in which the symbols have the following meaning:
$R^a$ is on each occurrence, identically or differently, H, a substituted or unsubstituted aromatic or heteroaromatic group, an alkyl, cycloalkyl, alkoxy, aralkyl, aryloxy, arylthio, alkoxycarbonyl, silyl or carboxyl group, a halogen atom, a cyano group, a nitro group or a hydroxyl group;
r is 0, 1, 2, 3 or 4, and
s is 0, 1, 2, 3, 4 or 5.

Preference is given, inter alia, to polymers having hole-transport or hole-injection properties, containing at least one of the following recurring units of the formula HTP-2:

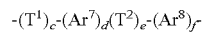

HTP-2 in which the symbols have the following meaning:
$T^1$ and $T^2$ are selected independently from thiophene, selenophene, thieno-[2,3-b]thiophene, thieno[3,2-b]thiophene, dithienothiophene, pyrrole and aniline, where these groups may be substituted by one or more radicals $R^b$;

$R^b$ is selected independently on each occurrence from halogen, —CN, —NC, —NCO, —NCS, —OCN, —SCN, —C(=O)NR$^o$R$^{oo}$, —C(=O)X, —C(=O)R$^o$, —NH$_2$, —NR$^o$R$^{oo}$, —SH, —SR$^o$, —SO$_3$H, —SO$_2$R$^o$, —OH, —NO$_2$, —CF$_3$, —SF$_5$, an optionally substituted silyl, carbyl or hydrocarbyl group having 1 to 40 carbon atoms, which may optionally be substituted and may optionally contain one or more heteroatoms;

R$^o$ and R$^{oo}$ are each independently H or an optionally substituted carbyl or hydrocarbyl group having 1 to 40 carbon atoms, which may optionally be substituted and may optionally contain one or more heteroatoms;

Ar$^7$ and Ar$^8$ represent, independently of one another, a monocyclic or polycyclic aryl or heteroaryl group, which may optionally be substituted and may optionally be bonded to the 2,3-position of one or both adjacent thiophene or selenophene groups;

c and e are, independently of one another, 0, 1, 2, 3 or 4, where

1<c+e≤6;

d and f are, independently of one another, 0, 1, 2, 3 or 4.

Preferred examples of polymers having hole-transport or hole-injection properties are described, inter alia, in WO 2007/131582 A1 and WO 2008/009343 A1.

The polymer having electron-injection and/or electron-transport properties employed as organic functional material, containing structural elements from group 2, may preferably contain units which correspond to the electron-injection and/or electron-transport materials described above.

Further preferred structural elements of group 2 which have electron-injection and/or electron-transport properties are derived, for example, from pyridine, pyrimidine, pyridazine, pyrazine, oxadiazole, quinoline, quinoxaline and phenazine groups, but also triarylborane groups or further O—, S- or N-containing heterocycles having a low LUMO level. These structural elements of group 2 preferably have an LUMO of below –2.7 eV (against vacuum level), particularly preferably below –2.8 eV.

The organic functional material can preferably be a polymer which contains structural elements from group 3, where structural elements which improve the hole and electron mobility (i.e. structural elements from groups 1 and 2) are connected directly to one another. Some of these structural elements can serve as emitters here, where the emission colours may be shifted, for example, into the green, red or yellow. Their use is therefore advantageous, for example, for the generation of other emission colours or a broad-band emission by polymers which originally emit in blue.

The polymer having light-emitting properties employed as organic functional material, containing structural elements from group 4, may preferably contain units which correspond to the emitter materials described above. Preference is given here to polymers containing phosphorescent groups, in particular the emitting metal complexes described above which contain corresponding units containing elements from groups 8 to 10 (Ru, Os, Rh, Ir, Pd, Pt).

The polymer employed as organic functional material containing units of group 5 which improve the transition from the so-called singlet state to the triplet state can preferably be employed in support of phosphorescent compounds, preferably the polymers containing structural elements of group 4 described above. A polymeric triplet matrix can be used here.

Suitable for this purpose are, in particular, carbazole and connected carbazole dimer units, as described, for example, in DE 10304819 A1 and DE 10328627 A1. Also suitable for this purpose are ketone, phosphine oxide, sulfoxide, sulfone and silane derivatives and similar compounds, as described, for example, in DE 10349033 A1. Furthermore, preferred structural units can be derived from compounds which have been described above in connection with the matrix materials employed together with phosphorescent compounds.

The further organic functional material is preferably a polymer containing units of group 6 which influence the morphology and/or the emission colour of the polymers. Besides the polymers mentioned above, these are those which have at least one further aromatic or another conjugated structure which do not count amongst the above-mentioned groups. These groups accordingly have only little or no effect on the charge-carrier mobilities, the non-organometallic complexes or the singlet-triplet transition.

The polymers may also include cross-linkable groups such as styrene, benzocyclobutene, epoxide and oxetane moieties.

Structural units of this type are able to influence the morphology and/or the emission colour of the resultant polymers. Depending on the structural unit, these polymers can therefore also be used as emitters.

In the case of fluorescent OLEDs, preference is therefore given to aromatic structural elements having 6 to 40 C atoms or also tolan, stilbene or bisstyrylarylene derivative units, each of which may be substituted by one or more radicals. Particular preference is given here to the use of groups derived from 1,4-phenylene, 1,4-naphthylene, 1,4- or 9,10-anthrylene, 1,6-, 2,7- or 4,9-pyrenylene, 3,9- or 3,10-perylenylene, 4,4'-biphenylene, 4,4"-terphenylylene, 4,4'-bi-1,1'-naphthylylene, 4,4'-tolanylene, 4,4'-stilbenylene or 4,4"-bisstyrylarylene derivatives.

The polymer employed as organic functional material preferably contains units of group 7, which preferably contain aromatic structures having 6 to 40 C atoms which are frequently used as backbone.

These include, inter alia, 4,5-dihydropyrene derivatives, 4,5,9,10-tetra-hydropyrene derivatives, fluorene derivatives, which are disclosed, for example, in U.S. Pat. No. 5,962,631, WO 2006/052457 A2 and WO 2006/118345A1, 9,9-spirobifluorene derivatives, which are disclosed, for example, in WO 2003/020790 A1, 9,10-phenanthrene derivatives, which are disclosed, for example, in WO 2005/104264 A1, 9,10-dihydrophenanthrene derivatives, which are disclosed, for example, in WO 2005/014689 A2, 5,7-dihydrodibenzoxepine derivatives and cis- and trans-indenofluorene derivatives, which are disclosed, for example, in WO 2004/041901 A1 and WO 2004/113412 A2, and binaphthylene derivatives, which are disclosed, for example, in WO 2006/063852 A1, and further units which are disclosed, for example, in WO 2005/056633 A1, EP 1344788 A1, WO 2007/043495 A1, WO 2005/033174 A1, WO 2003/099901 A1 and DE 102006003710.

Particular preference is given to structural units of group 7 which are selected from fluorene derivatives, which are disclosed, for example, in U.S. Pat. No. 5,962,631, WO 2006/052457 A2 and WO 2006/118345 A1, spirobifluorene derivatives, which are disclosed, for example, in WO 2003/020790 A1, benzofluorene, dibenzofluorene, benzothiophene and dibenzofluorene groups and derivatives thereof, which are disclosed, for example, in WO 2005/056633 A1, EP 1344788 A1 and WO 2007/043495 A1.

Especially preferred structural elements of group 7 are represented by the general formula PB-1:

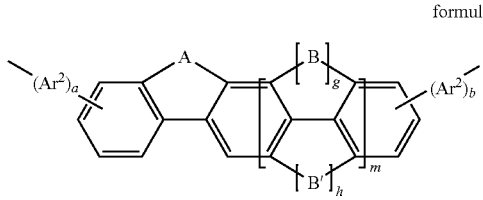

formula PB-1 in which the symbols and indices have the following meanings:

A, B and B' are each, also for different recurring units, identically or differently, a divalent group, which is preferably selected from —$CR^cR^d$—, —$NR^c$—, —$PR^c$—, —O—, —S—, —SO—, —$SO_2$—, —CO—, —CS—, —CSe—, —P(=O)$R^c$—, —P(=S)$R^c$— and —$SiR^cR^d$—;

$R^c$ and $R^d$ are selected on each occurrence, independently, from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, an optionally substituted silyl, carbyl or hydrocarbyl group having 1 to 40 carbon atoms, which may optionally be substituted and may optionally contain one or more heteroatoms, where the groups $R^c$ and $R^d$ may optionally form a spiro group with a fluorene radical to which they are bonded;

X is halogen;

$R^0$ and $R^{00}$ are each, independently, H or an optionally substituted carbyl or hydrocarbyl group having 1 to 40 carbon atoms, which may optionally be substituted and may optionally contain one or more heteroatoms;

g is in each case, independently, 0 or 1 and h is in each case, independently, 0 or 1, where the sum of g and h in a sub-unit is preferably 1;

m is an integer 1;

$Ar^1$ and $Ar^2$ represent, independently of one another, a monocyclic or polycyclic aryl or heteroaryl group, which may optionally be substituted and may optionally be bonded to the 7,8-position or the 8,9-position of an indenofluorene group;

a and b are, independently of one another, 0 or 1.

If the groups $R^c$ and $R^d$ form a spiro group with the fluorene group to which these groups are bonded, this group preferably represents a spirobifluorene.

Particular preference is given to recurring units of the formula PB-1 which are selected from the group consisting of units of the formulae PB-1A to PB-1E:

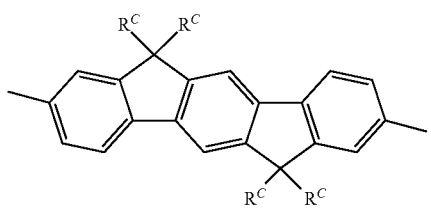

formula PB-1A

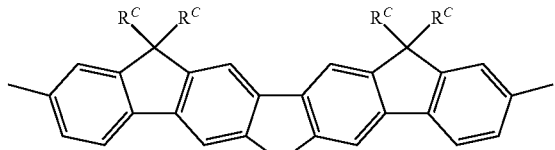

formula PB-1B

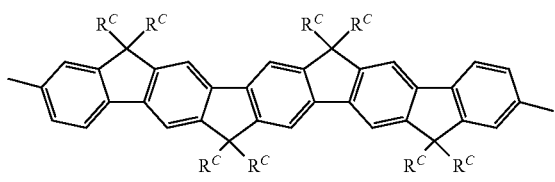

formula PB-1C

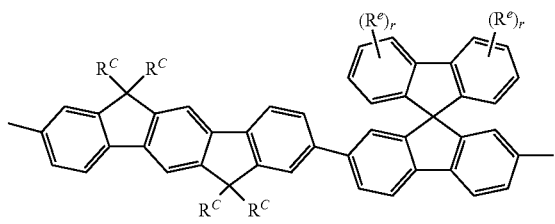

formula PB-1D

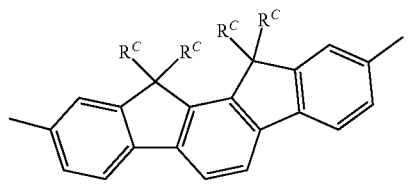

formula PB-1E where $R^c$ has the meaning described above for formula PB-1, r is 0, 1, 2, 3 or 4, and Re has the same meaning as the radical $R^c$.

$R^e$ is preferably —F, —Cl, —Br, —I, —CN, —$NO_2$, —NCO, —NCS, —OCN, —SCN, —C(=O)$NR^0R^{00}$, —C(=O)X, —C(=O)$R^0$, —$NR^0R^{00}$, an optionally substituted silyl, aryl or heteroaryl group having 4 to 40, preferably 6 to 20, C atoms, or a straight-chain, branched or cyclic alkyl, alkoxy, alkylcarbonyl, alkoxycarbonyl, alkylcarbonyloxy or alkoxycarbonyloxy group having 1 to 20, preferably 1 to 12, C atoms, where one or more hydrogen atoms may optionally be substituted by F or Cl, and the groups $R^0$, $R^{00}$ and X have the meaning described above for formula PB-1.

Particular preference is given to recurring units of the formula PB-1 which are selected from the group consisting of units of the formulae PB-1F to PB-1I:

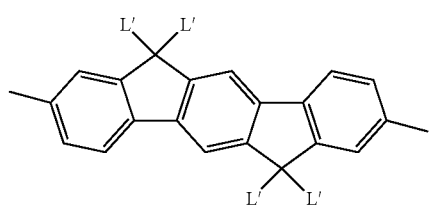

formula PB-1F

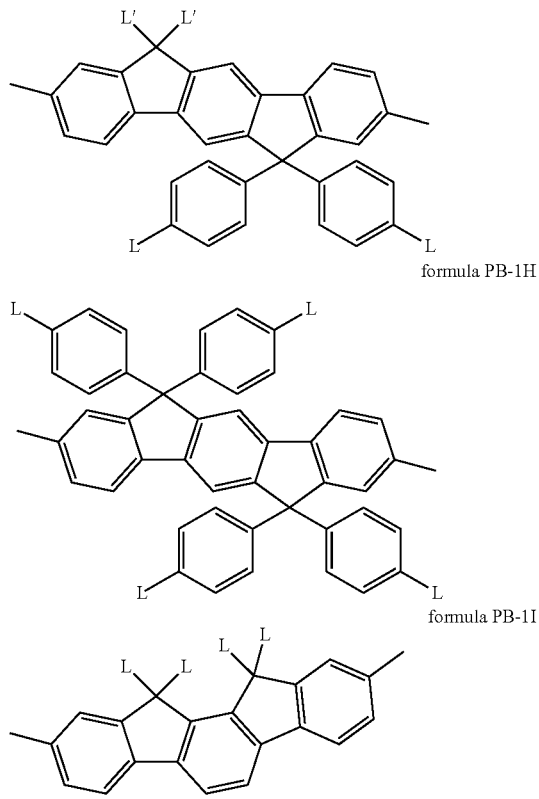

formula PB-1G formula PB-1H formula PB-1I in which the symbols have the following meaning:
L is H, halogen or an optionally fluorinated, linear or branched alkyl or alkoxy group having 1 to 12 C atoms and preferably stands for H, F, methyl, i-propyl, t-butyl, n-pentoxy or trifluoromethyl; and
L' is an optionally fluorinated, linear or branched alkyl or alkoxy group having 1 to 12 C atoms and preferably stands for n-octyl or n-octyloxy.

For carrying out the present invention, preference is given to polymers which contain more than one of the structural elements of groups 1 to 7 described above. It may furthermore be provided that the polymers preferably contain more than one of the structural elements from one group described above, i.e. comprise mixtures of structural elements selected from one group.

Particular preference is given, in particular, to polymers which, besides at least one structural element which has light-emitting properties (group 4), preferably at least one phosphorescent group, additionally contain at least one further structural element of groups 1 to 3, 5 or 6 described above, where these are preferably selected from groups 1 to 3.

The proportion of the various classes of groups, if present in the polymer, can be in broad ranges, where these are known to the person skilled in the art. Surprising advantages can be achieved if the proportion of one class present in a polymer, which is in each case selected from the structural elements of groups 1 to 7 described above, is preferably in each case ≥5 mol %, particularly preferably in each case ≥10 mol %.

The preparation of white-emitting copolymers is described in detail, inter alia, in DE 10343606 A1.

In order to improve the solubility, the polymers may contain corresponding groups. It may preferably be provided that the polymers contain substituents, so that on average at least 2 non-aromatic carbon atoms, particularly preferably at least 4 and especially preferably at least 8 non-aromatic carbon atoms are present per recurring unit, where the average relates to the number average. Individual carbon atoms here may be replaced, for example, by O or S. However, it is possible for a certain proportion, optionally all recurring units, to contain no substituents which contain non-aromatic carbon atoms. Short-chain substituents are preferred here, since long-chain substituents can have adverse effects on layers which can be obtained using organic functional materials. The substituents preferably contain at most 12 carbon atoms, preferably at most 8 carbon atoms and particularly preferably at most 6 carbon atoms in a linear chain.

The polymer employed in accordance with the invention as organic functional material can be a random, alternating or regioregular copolymer, a block copolymer or a combination of these copolymer forms.

In a further embodiment, the polymer employed as organic functional material can be a non-conjugated polymer having side chains, where this embodiment is particularly important for phosphorescent OLEDs based on polymers. In general, phosphorescent polymers can be obtained by free-radical copolymerisation of vinyl compounds, where these vinyl compounds contain at least one unit having a phosphorescent emitter and/or at least one charge-transport unit, as is disclosed, inter alia, in U.S. Pat. No. 7,250,226 B2. Further phosphorescent polymers are described, inter alia, in JP 2007/211243 A2, JP 2007/197574 A2, U.S. Pat. No. 7,250,226 B2 and JP 2007/059939 A.

In a further preferred embodiment, the non-conjugated polymers contain backbone units, which are connected to one another by spacer units. Examples of such triplet emitters which are based on non-conjugated polymers based on backbone units are disclosed, for example, in DE 102009023154.

In a further preferred embodiment, the non-conjugated polymer can be designed as fluorescent emitter. Preferred fluorescent emitters which are based on non-conjugated polymers having side chains contain anthracene or benzanthracene groups or derivatives of these groups in the side chain, where these polymers are disclosed, for example, in JP 2005/108556, JP 2005/285661 and JP 2003/338375.

These polymers can frequently be employed as electron- or hole-transport materials, where these polymers are preferably designed as non-conjugated polymers.

Furthermore, the functional compounds employed as organic functional materials in the solutions used in the present invention preferably have, in the case of polymeric compounds, a molecular weight $M_w$ of ≥10,000 g/mol, particularly preferably ≥20,000 g/mol and especially preferably ≥50,000 g/mol.

The molecular weight $M_w$ of the polymers here is preferably in the range from 10,000 to 2,000,000 g/mol, particularly preferably in the range from 20,000 to 1,000,000 g/mol and very particularly preferably in the range from 50,000 to 300,000 g/mol. The molecular weight $M_w$ is determined by means of GPC(=gel permeation chromatography) against an internal polystyrene standard.

The publications cited above for description of the functional compounds are incorporated into the present application by way of reference for disclosure purposes.

The solutions used in the invention may comprise all organic functional materials which are necessary for the production of the respective functional layer of the electronic device. If, for example, a hole-transport, hole-injection, electron-transport or electron-injection layer is built up precisely from one functional compound, the solution comprises precisely this compound as organic functional material. If an emission layer comprises, for example, an emitter in combination with a matrix or host material, the solution comprises, as organic functional material, precisely the mixture of emitter and matrix or host material, as described in greater detail elsewhere in the present application.

Besides the said components, the solutions used in the invention may comprise further additives and processing assistants. These include, inter alia, surface-active substances (surfactants), lubricants and greases, additives which modify the viscosity, additives which increase the conductivity, dispersants, hydrophobicising agents, adhesion promoters, flow improvers, antifoams, deaerating agents, diluents, which may be reactive or unreactive, fillers, assistants, processing assistants, dyes, pigments, stabilisers, sensitisers, nanoparticles and inhibitors.

The present invention furthermore relates to an electronic device which is obtainable by the inventive process. The electronic device has at least two adjacent functional layers which are prepared by the above-mentioned inventive process for the production of an electronic device.

A solution used in the process of the present invention can be employed for the production of a layer or multilayered structure in which the organic functional materials are present in layers, as are required for the production of preferred electronic or opto-electronic components, such as OLEDs.

The solution used in the present invention can preferably be employed for the formation of functional layers on a substrate or one of the layers applied to the substrate.

An electronic device is taken to mean a device comprising two electrodes and at least two functional layers in between, where the functional layers comprise at least one organic or organometallic compound.

The electronic device is preferably an organic electronic device such as e.g. an organic electroluminescent device (OLED), a polymeric electroluminescent device (PLED), an organic integrated circuit (O—IC), an organic field-effect transistor (O-FET), an organic thin-film transistor (O-TFT), an organic, light-emitting transistor (O-LET), an organic solar cell (O—SC), an organic, optical detector, an organic photoreceptor, an organic field-quench device (O-FQD), an organic electrical sensor, a light-emitting electrochemical cell (LEC) or an organic laser diode (O-laser).

Active components are generally the organic or inorganic materials which are introduced between the anode and the cathode, where these active components effect, maintain and/or improve the properties of the electronic device, for example its performance and/or its lifetime, for example charge-injection, charge-transport or charge-blocking materials, but in particular emission materials and matrix materials. The organic functional material which can be employed for the production of functional layers of electronic devices accordingly preferably comprises an active component of the electronic device.

Organic electroluminescent devices (OLEDs) are a preferred embodiment of the present invention. The OLED comprises a cathode, an anode and at least two functional layers, wherein one functional layer is an emitting layer.

It is furthermore preferred to employ a mixture of two or more triplet emitters together within a matrix as emitting layer. The triplet emitter having the shorter-wave emission spectrum serves as co-matrix here for the triplet emitter having the longer-wave emission spectrum.

The proportion of the matrix material in the emitting layer in this case is preferably between 50 and 99.9% by volume, particularly preferably between 80 and 99.5% by volume and especially preferably between 92 and 99.5% by volume for fluorescent emitting layers and between 70 and 97% by volume for phosphorescent emitting layers.

Correspondingly, the proportion of the dopant is preferably between 0.1 and 50% by volume, particularly preferably between 0.5 and 20% by volume and especially preferably between 0.5 and 8% by volume for fluorescent emitting layers and between 3 and 15% by volume for phosphorescent emitting layers.

An emitting layer of an organic electroluminescent device may also encom-pass systems which comprise a plurality of matrix materials (mixed-matrix systems) and/or a plurality of dopants. In this case too, the dopants are generally the materials whose proportion in the system is the smaller and the matrix materials are the materials whose proportion in the system is the greater. In individual cases, however, the proportion of an individual matrix material in the system may be smaller than the proportion of an individual dopant.

The mixed-matrix systems preferably comprise two or three different matrix materials, particularly preferably two different matrix materials. One of the two materials here is preferably a material having hole-transporting properties or a wide-band-gap material and the other material is a material having electron-transporting properties. However, the desired electron-transporting and hole-transporting properties of the mixed-matrix components may also be combined principally or completely in a single mixed-matrix component, where the further mixed-matrix component(s) fulfil(s) other functions. The two different matrix materials may be present here in a ratio of 1:50 to 1:1, preferably 1:20 to 1:1, particularly preferably 1:10 to 1:1 and especially preferably 1:4 to 1:1. Mixed-matrix systems are preferably employed in phosphorescent organic electroluminescent devices. Further details on mixed-matrix systems can be found, for example, in WO 2010/108579.

Apart from these layers, an organic electroluminescent device may also comprise further layers, for example in each case one or more hole-injection layers, hole-transport layers, hole-blocking layers, electron-transport layers, electron-injection layers, exciton-blocking layers, electron-blocking layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. It is possible here for one or more hole-transport layers to be p-doped, for example with metal oxides, such as $MoO_3$ or $WO_3$, or with (per) fluorinated electron-deficient aromatic compounds, and/or for one or more electron-transport layers to be n-doped. It is likewise possible for interlayers, which have, for example, an exciton-blocking function and/or control the charge balance in the electroluminescent device, to be introduced between two emitting layers. However, it should be pointed out that each of these layers does not necessarily have to be present.

The thickness of the functional layers, for example the hole-transport and/or hole-injection layer, can preferably be in the range from 1 to 500 nm, particularly preferably in the range from 2 to 200 nm.

In a further embodiment of the present invention, the electronic device comprises more than two functional layers.

The process according to the invention can preferably be employed here for the production of several pairs of adjacent functional layers.

The electronic device may furthermore comprise functional layers built up from further low-molecular-weight compounds or polymers which have not been applied by the process according to the present invention. These can also be produced by evaporation of low-molecular-weight compounds in a high vacuum.

It may additionally be preferred to use the organic functional materials not as the pure substances, but instead as a mixture (blend) together with further polymeric, oligomeric, dendritic or low-molecular-weight substances of any desired type. These may, for example, improve the electronic or emission properties of the functional layer.

In a preferred embodiment of the present invention, the organic electroluminescent device here may comprise two or more emitting layers. If a plurality of emitting layers are present, these preferably have a plurality of emission maxima between 380 nm and 750 nm, resulting overall in white emission, i.e. various emitting compounds which are able to fluoresce or phosphorescent are used in the emitting layers. Very particular preference is given to three-layer systems, where the three layers exhibit blue, green and orange or red emission (for the basic structure see, for example, WO 2005/011013). White-emitting devices are suitable, for example, as backlighting of LCD displays or for general lighting applications.

It is also possible for a plurality of OLEDs to be arranged one above the other, enabling a further increase in efficiency with respect to the light yield to be achieved.

In order to improve the out-coupling of light, the final organic layer on the light-exit side in OLEDs can, for example, also be in the form of a nano-foam, resulting in a reduction in the proportion of total reflection.

Preference is furthermore given to an OLED in which one or more layers are applied by means of a sublimation process, in which the materials are applied by vapour deposition in vacuum sublimation units at a pressure below $10^{-5}$ mbar, preferably below $10^{-6}$ mbar, particularly preferably below $10^{-7}$ mbar.

It may furthermore be provided that one or more layers of an electronic device according to the invention are applied by means of the OVPD (organic vapour phase deposition) process or with the aid of carrier-gas sublimation, in which the materials are applied at a pressure between $10^{-5}$ mbar and 1 bar.

It may furthermore be provided that one or more layers of an electronic device according to the invention are produced from solution, such as, for example, by spin coating, or by means of any desired printing process, such as, for example, screen printing, flexographic printing or offset printing, but particularly preferably LITI (light induced thermal imaging, thermal transfer printing) or inkjet printing.

These layers may also be applied by a process which is different from the claimed process. For example, an orthogonal solvent can preferably be used here, which, although dissolving the functional material of a layer to be applied, does not dissolve the layer to which the functional material is applied.

The electronic device usually comprises a cathode and an anode (electrodes). The electrodes (cathode, anode) are selected for the purposes of the present invention in such a way that their band energies correspond as closely as possible to those of the adjacent, organic layers in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali-metal or alkaline-earth metal fluorides, but also the corresponding oxides (for example LiF, $Li_2O$, $BaF_2$, MgO, NaF, etc.). The layer thickness of this layer is preferably between 0.1 and 10 nm, particularly preferably between 0.2 and 8 nm, especially preferably between 0.5 and 5 nm.

The anode preferably comprises materials having a high work function. The anode preferably has a potential greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to facilitate either irradiation of the organic material (O—SCs) or the coupling-out of light (OLEDs/PLEDs, O-lasers). A preferred structure uses a transparent anode. Preferred anode materials here are conductive, mixed metal oxides. Particular preference is given to indium tin oxide (ITO) or indium zinc oxide (IZO). Preference is furthermore given to conductive, doped organic materials, in particular conductive, doped polymers, such as, for example, poly(ethylenedioxythiophene) (PEDOT) and polyaniline (PANI) or derivatives of these polymers. It is furthermore preferred for a p-doped hole-transport material to be applied as hole-injection layer to the anode, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO energy, i.e. an HOMO energy with a large negative value.

In general, all materials which are used for the functional layers in accordance with the prior art can be used in the further functional layers of the electronic device.

The electronic device is correspondingly structured in a manner known per se, depending on the application, provided with contacts and finally hermetically sealed, since the lifetime of such devices is drastically shortened in the presence of water and/or air.

The process for the preparation of an electronic device and the electronic device, in particular the organic electroluminescent device, obtainable therefrom are distinguished over the prior art by one or more of the following surprising advantages:

1. The electronic devices obtainable by the process according to the invention exhibit very high stability and a very long lifetime compared with electronic devices obtained by conventional processes.
2. The process according to the invention can be carried out using conventional equipment, so that cost advantages can also be achieved thereby.
3. The organic functional materials employed in the process according to the invention are not subject to any particular restrictions, enabling the process of the present invention to be employed comprehensively.

4. The functional layers obtainable using the process of the present invention exhibit excellent quality, in particular with respect to the uniformity of the functional layer.
5. The functional material in the first layer does not need to include crosslinkable groups. These groups are known to reduce the lifetime of devices.
6. The first layer does not need to undergo an hard-baking or thermal crosslinking step, lower process temperatures can be employed. This reduces thermal degradation in the material which improves the device performance.

The above-mentioned advantages are not accompanied by an impairment of the other electronic properties.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, are themselves inventive and are not to be regarded merely as part of the embodiments of the present invention. For these features, independent protection can be sought in addition or as an alternative to each invention presently claimed.

The person skilled in the art will be able to use the descriptions to produce further formulations and electronic devices according to the invention without the need to employ inventive skill and thus can carry out the invention throughout the claimed range.

The invention is explained in greater detail below with reference to working examples, but without being restricted thereby.

Working Examples

Dissolution Tests

The determination of the solubility of a material in a solvent can be performed following ISO norm 7579:2009, which describes solubility determination by photometric or gravimetric methods. The photometric technique is recommended here, since the boiling points of the solvents considered are higher than 120° C.

Dissolution tests as described in the following were performed. The experiment was designed with particular focus on ease of reproducibility. The material(s) to be analyzed (which are used to form the first functional layer) were weighed into a transparent glass flask. A solvent (or a preformed solvent mixture) belonging to the list established in Table 3 was then added to the solid mixture at once, calculated to reach a final concentration of 7 g/L. The mixture was stirred at 600 rpm using a magnetic stirrer and at room temperature (25° C.) until complete dissolution, which was judged by visual inspection of the mixture. Towards the end of the dissolution test, the mixture can additionally be examined under illumination perpendicular to the line of sight to help identify undissolved particles. "Time of dissolution", also sometimes referred to as "dissolution time" $t_{DISS}$ mentioned in this invention was measured using a chronometer, and quantifies the time between addition of the solvent and beginning of stirring until the disappearance of the last pieces of material into solution. The dissolution rate is determined by dividing 7 g/L by the time until full dissolution was obtained (the "dissolution time").

For the results depicted below, a hole-transport material (HTL) polymer (polymer P1) as described in PCT/EP2015/002476 was used. The solvents were classified according to their dissolution time $t_{DISS}$ at 25° C. and characterized by a dissolution type (see Table 2). Results of the dissolution test are presented in Table 3.

TABLE 2

Assessment of the dissolution time and dissolution rate.

| Dissolution Type | Corresponding Dissolution Time $t_{DISS}$ at 25° C. | Dissolution Rate [g/(L · min)] |
| --- | --- | --- |
| Type A | 0 to 14 minutes | >0.466 |
| Type B | 15 to 29 min | 0.466-0.233 |
| Type C | 30 to 59 min | 0.233-0.116 |
| Type D | 60 to 120 min | 0.116-0.058 |
| Type E | More than 120 min | <0.058 |
| Type F | Not solubilized | 0 |

TABLE 3

Results for dissolution experiments with different solvents for one reference material.

| Solvent Name | Dissolution Type |
| --- | --- |
| 3-Phenoxytoluene | Type C |
| Cyclohexyl hexanoate | Type D |
| Menthyl isovalerate | Type E |
| Menthyl acetate | Type E |
| 4-Tertbutyl cyclohexyl acetate | Type E |
| Dicyclohexylketone | Type D |
| Isosorbide dimethyl ether | Type F |
| N-methoxy-N-methylbenzamide | Type F |
| Ethyl 3-methoxybenzoate | Type D |
| Ethyl-2-methoxybenzoate | Type D |
| Dibutylaniline | Type D |
| Ethyl benzoate | Type A |
| Butyl benzoate | Type B |
| Isobutyric acid p-tolyl ester | Type C |
| Phenyl propionate | Type E |

HTL Layer Stability Test Method

1. Substrate Preparation

Figure 8:
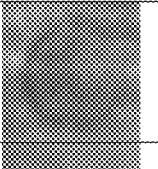
FIG. 8: Layer Damage Test Results
Figure 8:
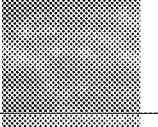
Figure 8:
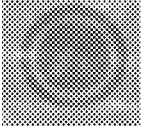
Figure 8:
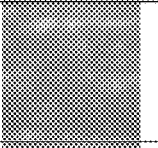
Figure 8:
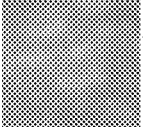
Figure 8:
Figure 8:
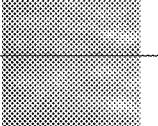
Figure 8:
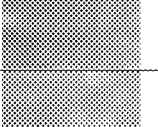
Figure 8:
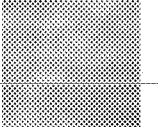
Figure 8:
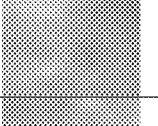

On a plain glass substrate of 30000×30000×1100 micron size the "to-be-tested" material (in this case the identical material HTM-2 which was used for the dissolution test or a different HTM like HTM-1, HTM-3 to HTM-7 was used as indicated in FIG. 8) is spin-coated from solution. The solution contains between five and fifty grams of material per liter of solvent. The formulation is prepared by weighing the solid material into the solvent. The formulation is dissolved which can be facilitated by stirring the mixture for one to six hours at room temperature by using a magnetic stirrer at room temperature. If necessary temperature can be applied to assist dissolution. After full dissolution, the formulation is transferred into the glovebox and filtered under inert conditions using a 0.2 micron PTFE filter. The formulation is used to spin-coat a 50 nm thick layer on top of the glass slide. The thickness is measured using an Alpha-step D-500 stylus-type profilometer. The surface of a layer prepared using this preparation procedure is very flat and smooth. Average surface roughness (RMS) is below 1 nm. After deposition, the layer is annealed by placing the substrate for up to 1 hour on a hot-plate at a certain temperature, preferably more than 140° C., more preferably 140° C. to 230° C. In this case, a temperature of 220° C. for 30 minutes was used.

2. Layer Damage Test Conditions

Figure 2:
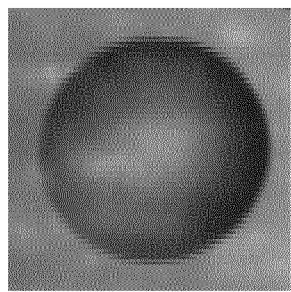
FIG. 2 shows a big drop consisting of nine small droplets printed very close together.
Figure 3:
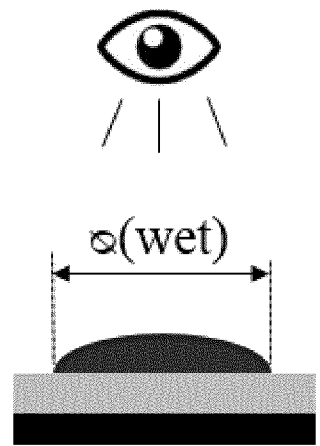
FIG. 3 is a schematic side view of a droplet. The droplet diameter is shown as measured through camera looking down from the top.

The stability of the deposited material layer is tested against a solvent A. This solvent A is filled into a solvent stable 10 pl single-use-cartridge of the printer (Dimatix DMP-2831, any similar drop-on-demand inkjet printer/printhead can be used). The cartridge size determines the droplet volume. In this case a ten picoliter cartridge is used. The printer should be operated in a vibration-free environment and should be leveled. The correct adjustment of printing conditions (detailed procedure please see Dimatix user manual) would be a droplet speed of 4 meters per second. The printing was done using a single nozzle only. The substrate which was prepared according to the procedure in 1) is now placed onto the substrate holder of the printer. The print-pattern (FIG. 1) is programmed to a have a specific drop volume. In this case the drop on the surface consists of nine small single droplets which are positioned very close together in a 3×3 matrix. After printing the resulting drop looks like in FIG. 2—all the single droplets merge to form a single drop of ninety picoliter drop volume (other drop volumes can be used, but need to be kept constant over one set of experiments). The image in FIG. 2 can be observed using the fiducial camera of the printer. It is looking down from the top onto the substrate (schematic view, see FIG. 3) parallel to the jetting direction.

3. Layer Damage Test Procedure

Figure 4:
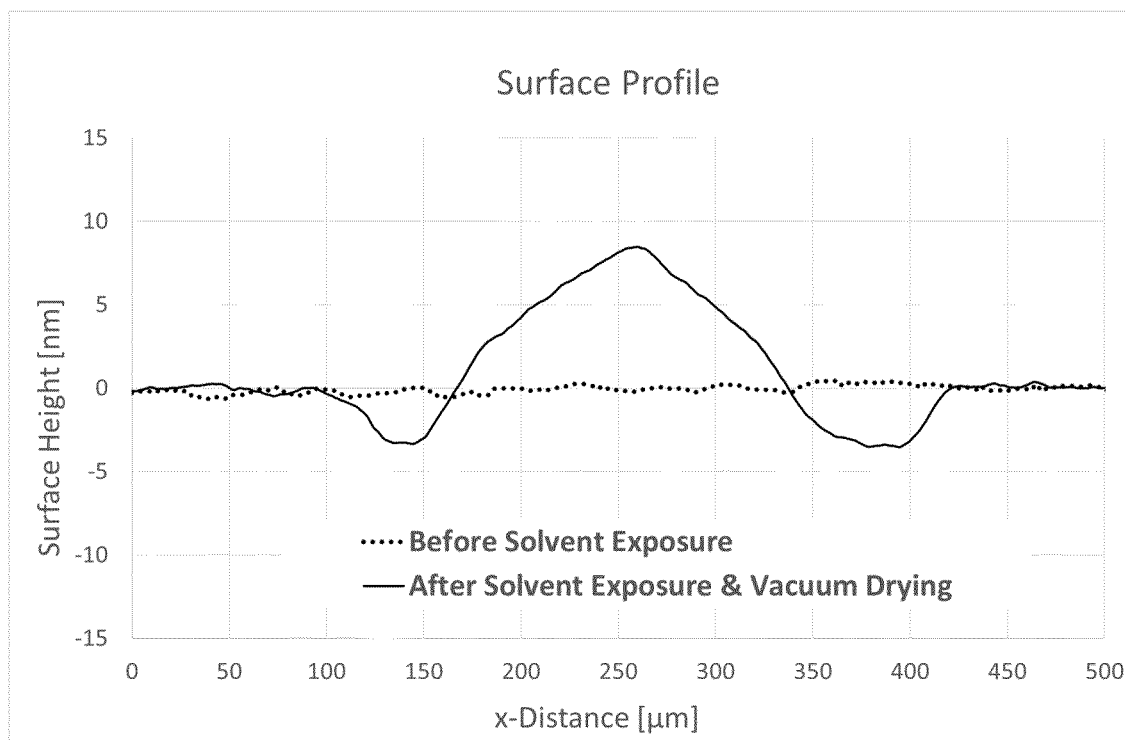
FIG. 4 shows a height profile which can be obtained by tactile measurement before and after a layer damage test.
Figure 5:
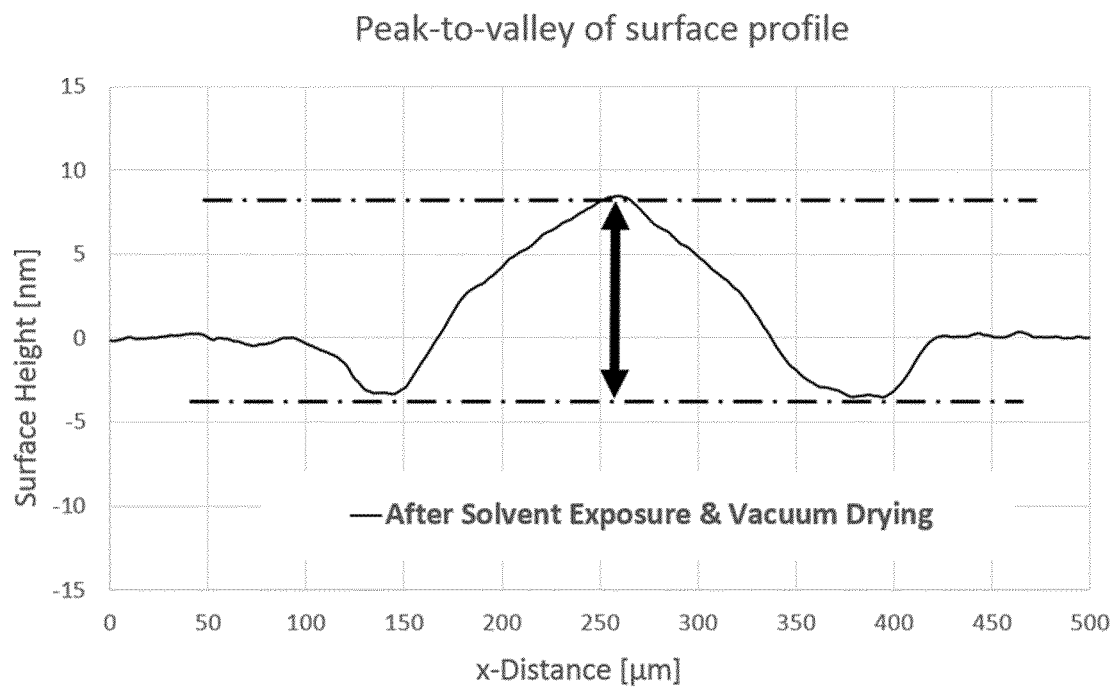
FIG. 5 illustrates Peak-to-Valley definition and measurement after solvent exposure.
Figure 6:
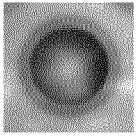
FIG. 6: Exemplary photos of droplet over soaking time, damage of solvent to layer and diameter measurement.
Figure 6:
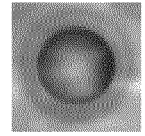
Figure 6:
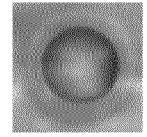
Figure 6:
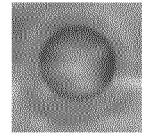
Figure 6:
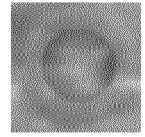
Figure 6:
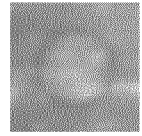
Figure 6:
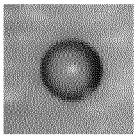
Figure 6:
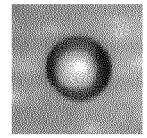
Figure 6:
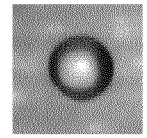
Figure 6:
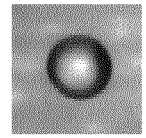
Figure 6:
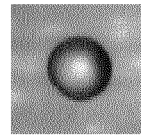
Figure 6:
Figure 6:
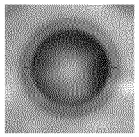
Figure 7:
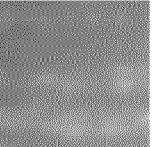
FIG. 7: KPI transfer into Damage Indicator (DI) and correlation of fiducial camera photos.
Figure 7:
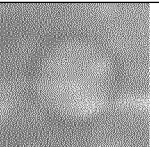
Figure 7:
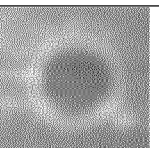
Figure 7:

Directly after printing a foto is taken using the fiducial camera (FIG. 2) and a timer is started. Several fotos are taken over the course of five minutes (see Table 4, FIG. 8), the so-called "soaking time". Immediately after printing the diameter of the sessile drop is measured. This can be done using the fiducial screen, as the view field and the x—/y-coordinates are linked. This means the x-/y-data of each marked position can be exported and therefore the distance of two points can be calculated. This value is used as the drop diameter and describes the interaction of the solvent on the surface. By looking at the fotos taken during soaking time the interaction between solvent and surface, and therefore the surface modifications, can be identified. Having a close look at the fotos in FIG. 6 shows an increasing dark shaded ring around the droplet borderline. This corresponds to the damage of the surface by the solvent. After five minutes soaking time the substrate is placed into a vacuum drying chamber to remove the solvent and dry the layer completely. The pressure reaches $1\cdot 10^{-4}$ mbar after sixty seconds of pumping. The substrate is fully dried for at least ten minutes. After drying the substrate is removed and the damage to the surface is quantified. There is another foto being taken using the fiducial camera of the printer again where you can already clearly identify damages to the layer. In addition, to quantify the damage to the layer, for example a tactile measurement such as Profilometry (see FIG. 4) or AFM (Atomic force microscopy) can be done. As a key performance indicator (KPI) to qualify the layer stability, the difference between lowest and highest point across the profile measurement was defined (see FIG. 5). The value has the unit nanometer. After determining the KPI the value is transferred into a Damage Indicator (DI) which can be seen in FIG. 7. This can then further be used to identify layer stability against a certain solvent.

TABLE 4

Layer damage timing table.

| | Soaking Time [sec] | | | | | |
|---|---|---|---|---|---|---|
| | 0 | 60 | 120 | 180 | 300 | dry |
| Photo taken | yes | yes | yes | yes | yes | yes |
| Diameter measured | yes | no | no | no | no | no |

To determine the layer damage rate, a measure for the rate of the dissolution of a layer exposed to the second solvent, the KPI is divided by the soaking time, which in this set of experiments was set to 300 seconds. The unit for the destruction factor is that of a rate of layer abrasion per time, here Nanometer per second [nm/sec]. In general, the soaking time should be in the range of a typical solution processing step. In accordance with the DI, for a given combination of a first material in the layer and a second solvent used to prepare the second solution, a destruction factor of less then 0.066 nm/sec is acceptable to be used according to the present invention. For some materials, the results are summarized in the following table.

Device Performance

Description of Fabrication Process

Glass substrates covered with pre-structured ITO and bank material were cleaned using ultrasonication in isopropanol followed by de-ionized water, then dried using an air-gun and a subsequent annealing on a hot-plate at 230° C. for 2 hours. The device structure is shown in FIG. 9.

A hole-injection layer (HIL) using a composition of a polymer (e.g. polymer P2) and a salt (e.g. salt D1) as described in PCT/EP2015/002476 was inkjet-printed onto the substrate and dried in vacuum. HIL inks were prepared at 7 g/L for each example using 3-phenoxytoluene. The HIL was then annealed at 200° C. for 30 minutes in air.

On top of the HIL, a hole-transport layer (HTL) was inkjet-printed, dried in vacuum and annealed at 220° C. for 30 minutes in nitrogen atmosphere. As material for the hole-transport layer, polymer HTM-1, HTM-2, HTM-3, HTM-4, HTM-5, HTM-6 or HTM-7 dissolved in 3-phenoxy toluene at a concentration of 7 g/L was used. The structure of the polymer HTM-1 is that of polymer P2 as described in PCT/EP2015/002476 and HTM-2 is the polymer P1 as described in PCT/EP2015/002476.

The structures of the polymers HTM-3, HTM-5 and HTM-6 as well as their molecular weights $M_w$ and polydispersities D are the following:

| Polymer | MON A | % | MON B | % | MON C | % | Mw/D |
|---|---|---|---|---|---|---|---|
| HTM-3 | MON-1-BE | 50 | MON-20-Br | 50 | — | — | 60K/2, 5 |
| HTM-5 | MON-2-Br | 50 | MON-20-BE | 50 | | | 80K/2, 1 |
| HTM-6 | MON-102-Br | 10 | MON-1-Br | | MON-20-BE | 50 | 110K/2, 2 |

The monomers used for the preparation of the polymers HTM-3, HTM-5 and HTM-6 are the following:
MON-1-Br
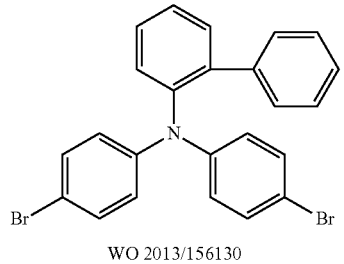
WO 2013/156130
MON-1-BE
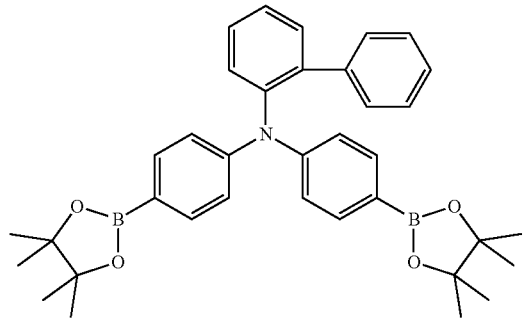
WO 2013/156130
MON-2-Br
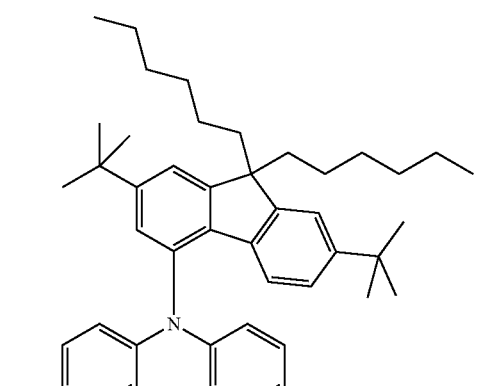
WO 2013/156130
MON-20-Br
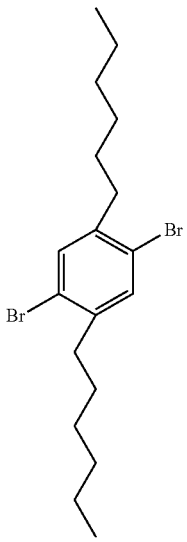
CAS 117635-21-9
MON-20-BE
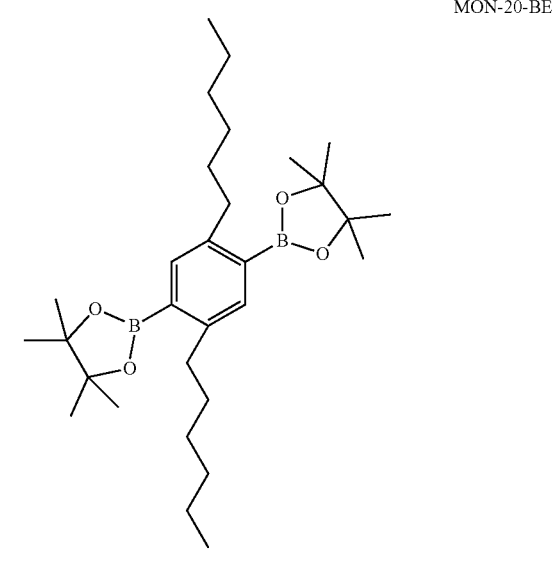
CAS 374934-77-7
MON-102-Br
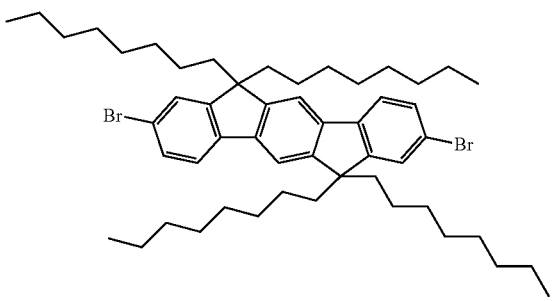
Macromolecules 2000, 33, 2016-2020
The structure of HTM-4 is described in WO2013/156130 A1 (Po18). The structure of HTM-7 is described in WO 2005/024971 A1 (Polymer B).
The green emissive layer (G-EML) was also inkjet-printed, vacuum dried and annealed at 150° C. for 10 minutes in nitrogen atmosphere. The ink for the green emissive layer contained in all working examples two host materials (i.e. HM-1 and HM-2) as well as one triplet emitter (EM-1) prepared in 3-phenoxytoluene and menthyl isovalerate at a concentration of 16 g/L. The materials were used in the following ratio: HM-1: HM-2: EM-1=20:60:20. The structures of the materials are the following:

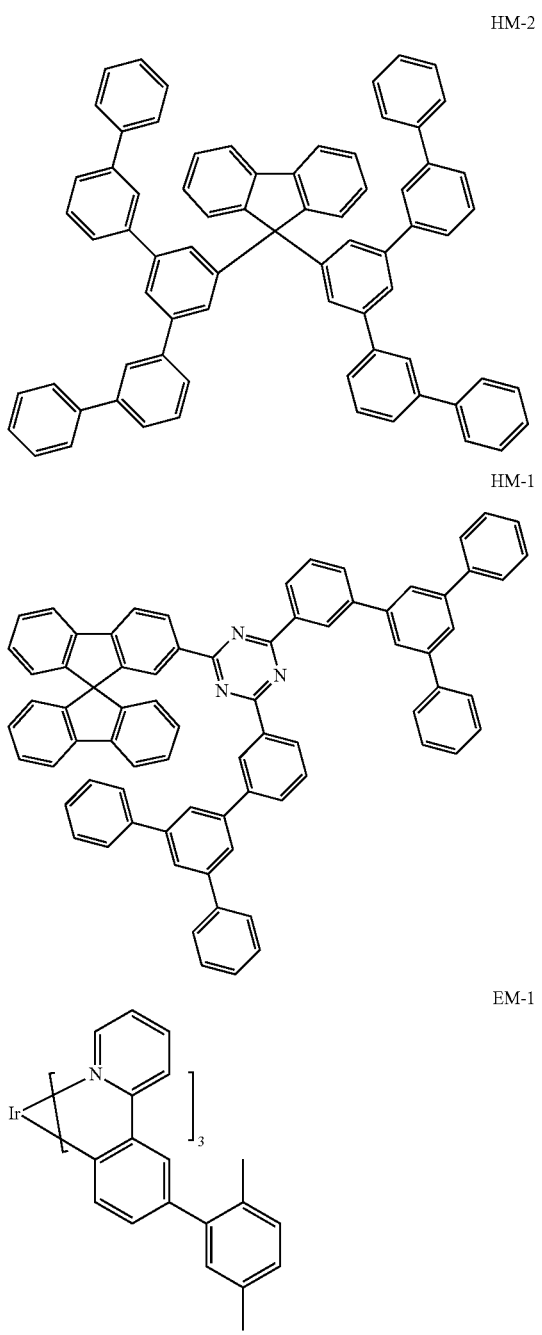

All inkjet printing processes were performed under yellow light and under ambient conditions.

The devices were then transferred into a vacuum deposition chamber where the deposition of a common hole blocking layer (HBL), an electron-transport layer (ETL), and a cathode (Al) was done using thermal evaporation (see FIG. 9). The devices were then characterized in the glovebox.

In the hole blocking layer (HBL) ETM-1 was used as a hole-blocking material. The material has the following structure:

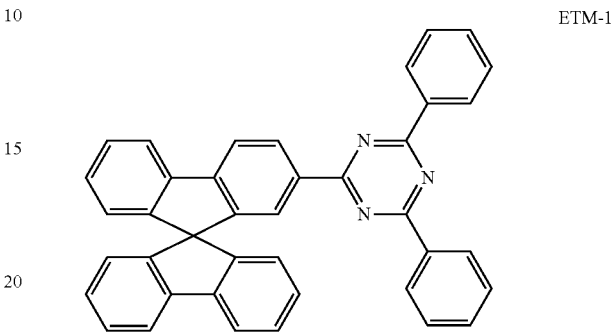

In the electron transport layer (ETL) a 50:50 mixture of ETM-1 and LiQ was used. LiQ is lithium 8-hydroxyquinolinate.

Finally, the Al electrode is vapor-deposited. The devices were then encapsulated in a glove box and physical characterization was performed in ambient air. FIG. 9 shows the device structure.

The device is driven with constant voltage provided by a Keithley 230 voltage source. The voltage over the device as well as the current through the device are measured with two Keithley 199 DMM multimeters. The brightness of the device is detected with a SPL-025Y brightness sensor, a combination of a photodiode with a photonic filter. The photo current is measured with a Keithley 617 electrometer. For the spectra, the brightness sensor is replaced by a glass fiber which is connected to the spectrometer input. The device lifetime is measured under a given current with an initial luminance. The luminance is then measured over time by a calibrated photodiode.

Results and Discussion

Four devices were prepared, including Device Example 1 (EML from 3-phenoxytouene on HTM-1), Device Example 2 (EML from menthyl isovalerate on HTM-1), Device Example 3 (EML from 3-phenoxytoluene on HTM-2), Device Example 4 (EML from menthyl isovalerate on HTM-2). Table 5 summarizes luminance efficiencies and external quantum efficiencies (EQE) at 1000 $cd/m^2$, as well as the device lifetimes (LT65) at 2000 $cd/m^2$. As can be seen from device experiment 3, 3-Phenoxytoluene (type C in the dissolution test, damage indicator "–" in the layer damage test) is not suitable to prepare working OLEDs when used as a solvent for the EML, whereas an EML ink prepared with menthyl isovalerate (device experiment 4) can be used to obtain the best performing device from this experiment series. From the experiments on HTM-1 (device experiments 1 and 2) it is obvious that a damage indicator "0" yields a working device, but the performance is worse than a combination with a damage indicator "++".

TABLE 5

Luminance efficiency, external quantum efficiency, operational voltage and device lifetime.

| | HTL | EML Solvent | Luminance efficiency at 1000 cd/m² (cd/A) | External quantum efficiency at 1000 cd/m² (%) | Lifetime (LT65) at 2000 cd/m² (hrs) |
|---|---|---|---|---|---|
| Device Ex. 1 | HTM-1 | 3-Phenoxytoluene | 60.8 | 16.7 | 9,000 |
| Device Ex. 2 | HTM-1 | Menthyl isovalerate | 63.0 | 17.1 | 12,000 |
| Device Ex. 3 | HTM-2 | 3-Phenoxytoluene | n.a. | n.a. | n.a. |
| Device Ex. 4 | HTM-2 | Menthyl isovalerate | 63.8 | 17.5 | 16,000 |

The invention claimed is:

1. A process for the preparation of an electronic device comprising a first functional layer and a second functional layer which form an interface,
wherein the process comprises the following process steps:
a1) depositing a first solution containing a first organic functional material and a first solvent on a support;
a2) drying said first solution and optionally annealing said first organic functional material to obtain a first functional layer;
b1) depositing a second solution containing a second organic functional material and a second solvent on the first functional layer; and
b2) drying said second solution and optionally annealing said second organic functional material to obtain a second functional layer;
characterized in that the absolute solubility of the first organic functional material in the second solvent is in the range from 0.1 to 200 g/L at 25° C. and in that the absolute solubility of the second organic functional material in the second solvent is >5.0 g/L and <500 g/L at 25° C.; and
wherein the dissolution rate of the first organic functional material in the second solvent is <0.116 g/(L·min) at 25° C.

2. The process according to claim 1,
wherein the second solvent has a layer damage rate (LDR) with respect to the first functional layer of less than 0.066 nm/sec at 25° C.

3. The process according to claim 2,
wherein the following condition applies:
d(layer1) >LDR·t(b1),
wherein d(layer1) is the thickness [nm] of the first functional layer; LDR is the layer damage rate [nm/sec] measured at 25° C.; and t(b1) is the time period [sec] in which process step b1 is carried out.

4. The process according to claim 1,
wherein the following condition applies:
$t_{Diss}$material1/solvent2) >2·t(b1),
wherein $t_{Diss}$ (material1/solvent2) is the dissolution time [sec] which is required to dissolve 7.00 g of the first organic functional material in 1.00 L of the second solvent at 25° C.; and t(b1) is the time period [sec] in which process step b1 is carried out.

5. The process according to claim 1,
wherein the first organic functional material is a non-crosslinkable polymer.

6. The process according to claim 5,
wherein the non-crosslinkable polymer is a hole-transport material.

7. The process according to claim 6,
wherein the hole-transport material is selected from the group consisting of polysilanes, aniline copolymers, thiophene oligomers, polythiophenes, poly(N-vinyl) carbazole, polypyrroles, polyanilines, polytriarylamines and mixtures thereof.

8. The process according to claim 1, characterized in that the content of the second organic functional material in the second solution is in the range from 0.001 to 20 weight-% based on the total weight of the second solution.

9. The process according to claim 1,
wherein the second organic functional material is a light-emitting material.

10. The process according to claim 9,
wherein the light-emitting material is a fluorescent or phosphorescent emitter selected from the group consisting of stilbene, stilbenamine, styrylamine, coumarine, rubrene, rhodamine, thiazole, thiadiazole, cyanine, thiophene, paraphenylene, perylene, phtalocyanine, porphyrin, ketone, quinoline, imine, anthracene, pyrene and phosphorescent metal complexes, and mixtures thereof.

11. The process according to claim 1,
wherein process step b1 is carried out in a time period of less than 600 sec.

12. The process according to claim 1,
wherein process step b1 is carried out at a temperature in the range from 5 to 50° C.

13. The process according to claim 1,
wherein the deposition of the second solution containing a second organic functional material and a second solvent on the first functional layer in process step b1 is carried out by a printing process or a coating process.

14. The process according to claim 1,
wherein the first solvent is an organic solvent selected from the group consisting of ketones, substituted and non-substituted aromatic, alicyclic or linear ethers, esters, amides, aromatic amines, sulfur compounds, nitro compounds, hydrocarbons, halogenated hydrocarbons, aromatic or heteroaromatic hydrocarbons, indane derivatives and halogenated aromatic or heteroaromatic hydrocarbons.

15. The process according to claim 1,
wherein the second solvent is an organic solvent having 8 to 14 carbon atoms and 1 to 3 oxygen and/or nitrogen atoms which contains one aromatic six-membered carbocyclic ring system or one or two aliphatic five- or six-membered carbocyclic ring systems.

16. The process according to claim 1, wherein the second solvent is an organic solvent having a boiling point in the range from 195 to 350° C. at 760 mm Hg.

17. The process according to claim 1, wherein the electronic device is an organic electroluminescent device.

18. An electronic device obtained by the process according to claim 1.

19. The process according to claim 1, characterized in that the absolute solubility of the first organic functional material in the second solvent is in the range from 5.1 to 200 g/L at 25° C. and in that the absolute solubility of the second organic functional material in the second solvent is >5.2 g/L at 25° C.

* * * * *